(12) United States Patent
Bengtson et al.

(10) Patent No.: US 8,090,972 B2
(45) Date of Patent: Jan. 3, 2012

(54) METHOD AND SYSTEM FOR REGISTERING EVENTS IN WIND TURBINES OF A WIND POWER SYSTEM

(75) Inventors: John Bengtson, Højbjerg (DK); Bo Lovmand, Hadsten (DK); Tage Kristensen, Århus N (DK); Niels Erik Danielsen, Herning (DK)

(73) Assignee: Vestas Wind Systems A/S, Aarhus (DK)

( * ) Notice: Subject to any disclaimer, the term of this patent is extended or adjusted under 35 U.S.C. 154(b) by 0 days.

(21) Appl. No.: 12/744,166

(22) PCT Filed: Nov. 26, 2008

(86) PCT No.: PCT/DK2008/000419
§ 371 (c)(1),
(2), (4) Date: May 21, 2010

(87) PCT Pub. No.: WO2009/068034
PCT Pub. Date: Jun. 4, 2009

(65) Prior Publication Data
US 2010/0268849 A1    Oct. 21, 2010

Related U.S. Application Data

(60) Provisional application No. 60/990,191, filed on Nov. 26, 2007.

(30) Foreign Application Priority Data

Nov. 26, 2007 (DK) ................... 2007 01683

(51) Int. Cl.
*G06F 1/12* (2006.01)
*G06F 13/42* (2006.01)
*H04L 7/00* (2006.01)

(52) U.S. Cl. ............... 713/400; 702/1; 702/2; 702/178; 702/187

(58) Field of Classification Search ............... 713/400; 702/1, 2, 178, 187
See application file for complete search history.

(56) References Cited

U.S. PATENT DOCUMENTS
5,896,524 A * 4/1999 Halstead et al. ............ 713/375
(Continued)

FOREIGN PATENT DOCUMENTS
EP    1531376 A1    5/2005
(Continued)

OTHER PUBLICATIONS

Danish Patent Office, Search Report issued in related Danish patent application serial No. PA 2007 01683 dated Apr. 28, 2008.
(Continued)

*Primary Examiner* — Vincent Tran
(74) *Attorney, Agent, or Firm* — Wood, Herron & Evans, LLP

(57) ABSTRACT

The invention relates to a method of registering events in a wind power system comprising at least two data processors, wherein the data processors of said wind power system are mutually time synchronized, wherein events are registered in said at least two data processors, wherein the timing of said events registered in different of said at least two data processors is established according to said time synchronization. According to an advantageous embodiment of the invention, events may be registered and preferably analyzed according to a common timing. This analyzing makes it possible to establish an analysis where events of different wind turbines are basically interrelated and where information regarding such interrelation is important or crucial for establishment of control or fault detection based on correctly timed events from different wind turbines.

20 Claims, 11 Drawing Sheets

U.S. PATENT DOCUMENTS

Figure 1:
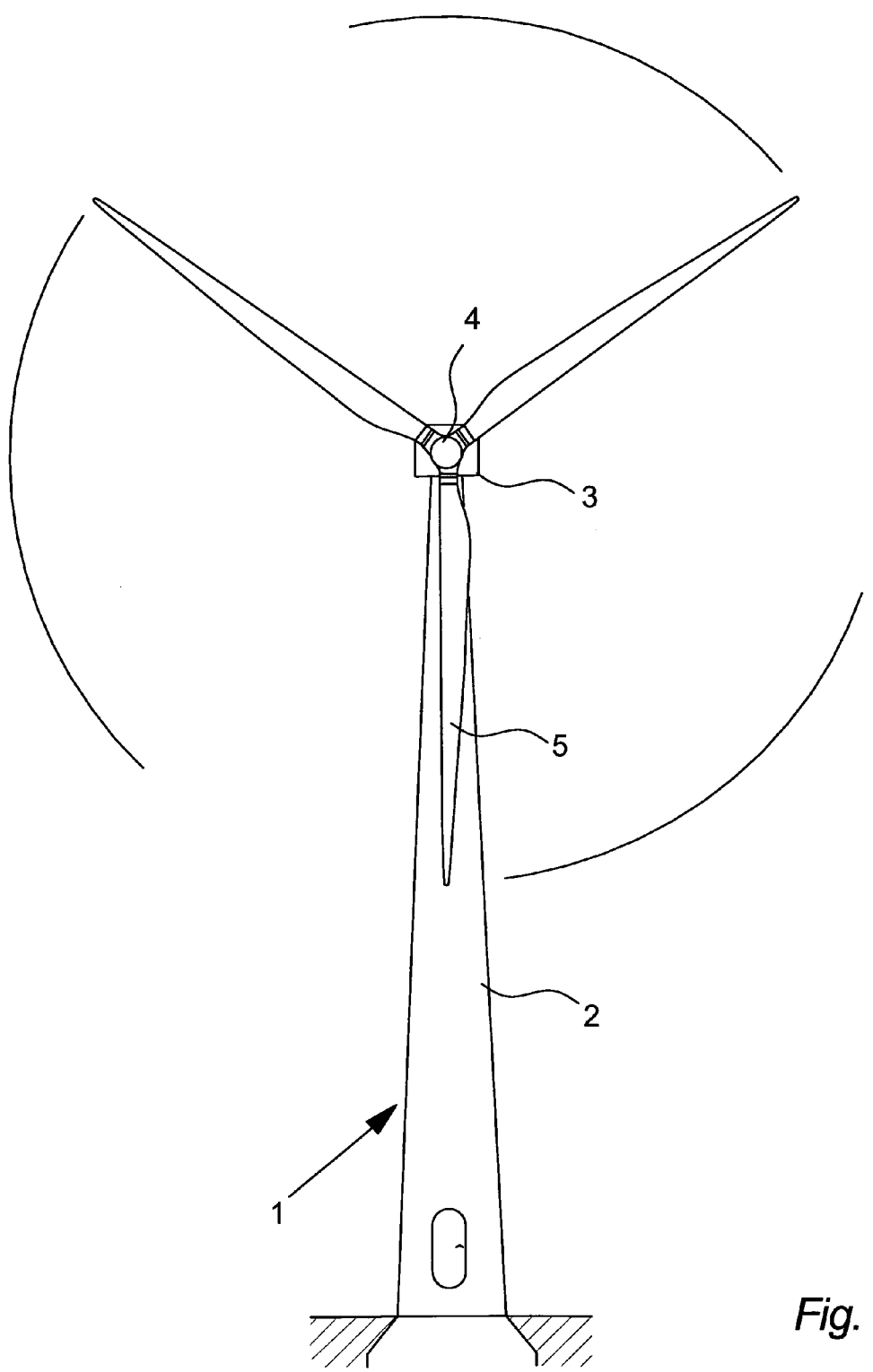

| | | | |
|---|---|---|---|
| 6,751,573 B1 * | 6/2004 | Burch | 702/178 |
| 2002/0029097 A1 * | 3/2002 | Pionzio et al. | 700/286 |
| 2004/0010350 A1 | 1/2004 | Lof et al. | |
| 2004/0230377 A1 * | 11/2004 | Ghosh et al. | 702/3 |
| 2005/0143865 A1 | 6/2005 | Gardner | |
| 2007/0094528 A1 * | 4/2007 | Fredriksson et al. | 713/375 |
| 2007/0182819 A1 * | 8/2007 | Monroe | 348/143 |

FOREIGN PATENT DOCUMENTS

| | | |
|---|---|---|
| WO | 9813966 A1 | 4/1998 |

OTHER PUBLICATIONS

European Patent Office, International Search Report issued in related international application No. PCT/DK2008/000419 dated Apr. 5, 2009.

Alonso, et al. "Industrial Control System for a Back-to-Back Multi-level NPC Converter Based on DSP and FPGA", Industrial Electronics, 2007, IEEE, Jun. 1, 2007, pp. 2358-2363.

* cited by examiner

METHOD AND SYSTEM FOR REGISTERING EVENTS IN WIND TURBINES OF A WIND POWER SYSTEM

FIELD OF THE INVENTION

The invention relates to a method and system for registering events in a wind power system having several data processors.

BACKGROUND OF THE INVENTION

Monitoring and control the wind turbines have been the subject to much focus over the recent years.

Wind turbines are typically grouped and the communication to these wind turbines are typically performed by means of suitable communication networks. Such networks may typically be applied for the purpose of controlling or monitoring the state of the individual wind turbines. Thus, events registered at an individual wind turbine may be transmitted to an external monitoring arrangement, e.g. a SCADA (SCADA; Supervisory Control And Data Acquisition), which gathers and analyses information from several wind turbines.

A problem related to such prior art networks is that the information which can be derived and established by these networks is relatively restricted. Furthermore in relation to wind power plants, which may cover relatively large geographic area, the transmission time for a signal from one end of a wind power plant to the other end of a wind power plant is increased.

SUMMARY OF THE INVENTION

The invention relates to a method for registering events in a wind power system comprising at least two data processors, said method comprising the steps of mutually synchronizing the data processors of said wind power system,
registering events in said at least two data processors and establishing the timing of said events registered in different of said at least two data processors according to said time synchronization.

According to an advantageous embodiment of the invention, events may be registered and preferably analyzed according to a common timing. This analyzing makes it possible to establish an analysis where events of different wind turbines are basically interrelated and where information regarding such interrelation is important or crucial for establishment of control or fault detection based on correctly timed events from different wind turbines.

Examples of such interrelated events may e.g. be overvoltage, overcurrent, voltage or current deviating from the expected sinus form, change in harmonic, change in phase, lightning events, trip of switch, breaker, converter, VAR compensator etc. and breakdown of electrical circuitry where the timing of the events becomes crucial to establish from where the triggering event occurred. This is in particular of importance in relation to such electrical circuitry as breakdowns at one place may be the result of a fault elsewhere.

Non-limiting examples of a time synchronization applicable within the scope of the invention are a protocol as IEEE 1588 and earth satellite system as the GPS, both establishing a way of synchronizing the timing.

In the present context, a wind turbine refers to a wind turbine and the associated control and registering circuitry. Thus, the control and registering circuitry may be physically incorporated into the nacelle, hub or tower of a wind turbine or it may be located externally to the nacelle, hub or tower.

The term "wind power system" is in accordance with an embodiment of the invention understood as a system related to the generation of power by means of the wind. Examples of a wind power system may be a wind power plant (comprising a plurality of wind turbines), a wind turbine or a substation or any combination there of.

The term "data processor" may in accordance with an embodiment of the invention be understood as any arrangement or element that is related to data processing. Different data processors are understood as data processors having individual clocks or are using or referring to different clocks. Examples of data processors are the wind turbine controller, the internal controllers of a wind turbine such as a top controller, a pitch controller, a hub controller etc. A data processor may also refer to internal controllers of a substation or a transformer station. The term "data processor" may physically be embodied in a PLC (Programmable Logic Controller), a DSP (DSP: Digital Signal Processor), a fuzzy logic computer, a biological computer, a neural logic computer or another data processing unit. In another embodiment of the invention the term "data processor" may even be understood as a complete wind power plant with several wind turbines.

Another advantageous feature in accordance with an embodiment of the invention is the possibility to perform a synchronous control of data processors such as actuators of a wind power plant.

Events may according to the invention be referred to as raw measurement or a stream of measurements such as current, power or voltage, processed data of such measurements and also specific indications or representations of an occurred event such as warnings, certain event detections, etc.

In an embodiment of the invention, said data processors comprises at least one wind turbine controller.

In an embodiment of the invention, said data processors are distributed in more than one wind turbine.

In an embodiment of the invention, said data processors is comprised in a wind turbine.

It is a very advantageous feature in accordance with an embodiment of the invention that the wind turbine controllers of different wind turbines are mutually time synchronized. This entails that a comparable event which occurs in different wind turbines may be used to make statistic measurements for optimization use and/or for fault/error detection in wind power plants.

In an embodiment of the invention, said data processors comprise at least one top controller, pitch controller, hub controller, programmable logic controller or any combination thereof.

According to an embodiment of the invention an example of one amongst a plurality of controllers could be a WMP6000.

In an embodiment of the invention, said wind power system comprises at least one wind power plant.

The invention may advantageously be implemented even in single wind turbines, but further advantages is obtained if the time synchronization is penetrating a larger system, such as a wind power plant, thereby obtaining the possibility of analyzing the performance and events in the system in a detailed level which as previously impossible.

In an embodiment of the invention, event information is transmitted to an event information analyzer and wherein said event information is derived from the events.

The event information to be transmitted may e.g. be a more or less complete representation of the registered events, a filtered representation of the registered event or e.g. event information which has been analyzed or processed when registered in the individual wind turbines.

In an embodiment of the invention, said event information analyzer analyzes the event information on the basis of said time synchronization According to a preferred embodiment of the invention, the analyzer establishes an analysis preferable on a runtime basis or alternatively as a batch process, thereby availing the analyzer to take the timing of a sequence of events into account.

Such analysis may be applied for the purpose of monitoring or control of one or more wind turbines. It may, moreover, be applied for the purpose of optimized detection faults when servicing wind turbines.

The event information analyzer is preferably an arrangement located externally to all or at least some of the wind turbines of the power plant. The event information analyzer may e.g. comprise a stand alone unit having a suitable communication interface or the analyzer may be completely integrated within a control and monitoring system such as a SCADA (SCADA; Supervisory Control And Data Acquisition) server.

In an embodiment of the invention, said event information is transmitted as time stamped events according to said time synchronization of the data processors, and
wherein said time stamped events are transmitted to said event information analyzer and wherein
said event information analyzer analyses the event information on the basis of said time synchronization.

An advantage of the application of time stamping of the events is that the events may be analyzed subsequently, e.g. remote, and carry exact timing, absolute or relative to the other related events. The time stamping of the events may also facilitate and easier and robust processing of the events, as a subsequent analyzing of the events may be performed or initiated at any time subsequent to the occurrence of events. Moreover, the time stamped events may be transferred between different processing units located at different positions of the system, centrally or de-centrally, without loss of information.

According to a further embodiment of the invention, time stamping of the events may be avoided insofar the network communicating the events to the analyzer is sufficiently fast.

In an embodiment of the invention, wherein said time stamped events are transmitted to said event information analyzer, wherein
said event information analyzer analyses the event information on the basis of said time synchronization by establishment of a timing based on the receipt of the event information.

When all data processors in accordance with an embodiment of the invention are synchronized, it is possible to perform a very advantageous analysis and comparison of specific events of the wind turbines. When the events, e.g. a similar specific error detected in e.g. several wind turbines at different points of time, it is possible to perform a mapping of the origin and the distribution route of specific events advantageously by means of mutual comparison.

The mapping information of a specific event may in accordance with the invention be very useful in relation to e.g. trouble-shooting issues.

When a similar event, e.g. a specific error, occurs in several or all data processors the fault detections of the wind turbines are not always registered in the monitoring equipment, e.g. in the central controller, in the same order as they have actually occurred. This is advantageously handled by the present invention wherein it is possible by means of the very precise local time synchronization of the wind turbines to map the event, i.e. determine the origin and the distribution route of the specific event.

According to an advantageous embodiment of the invention the registered data may be post-analyzed days, weeks or even months after the event had occurred.

In an embodiment of the invention, said event information analyzer establishes a sequence with reference to timing of received event information.

In an embodiment of the invention, said time synchronization includes synchronization to a master clock.

Different types of master clocks may be referred to within the scope of the invention. The master clock may be a precision clock available to the wind turbines and it may be established internally or externally to the wind turbines or the wind power plant.

A master clock may e.g. be included in a time synchronization arrangement internal or preferable external to the wind turbine.

In an embodiment of the invention, wherein said time synchronization is established by means of a time synchronization device and wherein each of said at least two data processors comprises a time synchronization device.

A local clock may typically be arranged within the wind turbine or in relation to the wind turbine.

In an embodiment of the invention, said time synchronization device synchronizes to a master clock and establishes a synchronized clock on the basis of said master clock and a local clock and wherein the local clock is comprised in or communicating with said time synchronization device.

In an embodiment of the invention, said master clock and/or said synchronized clock and/or said local clock is distributed within the wind power system using a hardware supported time protocol on a communication network or on a dedicated communication line.

According to an advantageous embodiment of the invention it might be very advantageous to use a hardware supported time protocol to communicate time synchronizing signals between data processors. Because hardware supported time protocols is optimized for this purpose.

According to an advantageous embodiment of the invention for some applications the transmission time e.g. defined by the transmission delay and propagation delay is less critical because of the precise times stamping of events as a consequence of the precise synchronized clocks in the wind power system.

In an embodiment of the invention, the at least two wind turbines comprises a local clock.

In an embodiment of the invention, said time synchronization is established on the basis of an internal clock of the wind power system.

The internal clock may e.g. be established by means of an internal clock generator of the wind power plant.

The internal clock may, moreover, according to a further embodiment of the invention be based on a time reference external to the wind power plant such as a global timing reference. According to a further embodiment of the invention, a wind turbine may be chosen to act as master clock reference to the others.

In an embodiment of the invention, said time synchronization is established on the basis of an external clock transmitted from an external time synchronization arrangement comprising a master clock.

An external clock in the present context is referred to a clock which is neither established in the wind turbines nor in the wind power plant.

The timing reference of the individual wind turbines may thus be established on the basis of a clock reference established externally to the turbines as well as the wind power plant control arrangement.

In an embodiment of the invention, the communication between said time synchronization device of the time stamped events connects to the master clock by means of e.g. a data communication network, a wireless network and/or a wired network.

In an embodiment of the invention, the communication from the time synchronization device of the time stamped events is performed via an existing data communication network of the wind power system.

In an embodiment of the invention, the time synchronization of data processors in the wind power system is established by using an existing communication network within the wind power system and/or a dedicated line and/or via an earth satellite system, such as a GPS.

According to an advantageous embodiment of the invention the time synchronization of data processors is done by using the existing communication network. This may e.g. be done by means of one master clock forwarding time-tick pulses which the data processors are synchronized against or simply by communication between the data processors.

According to an advantageous embodiment of the invention it might be very advantageous to use a dedicated line to enable time synchronization between at least tow data processors. If a dedicated line is used no other data traffic is colliding or taken bandwidth from the time synchronizing signals.

According to an advantageous embodiment of the invention the earth satellite system is a GPS system or further developments of such. The earth satellite system may generate a time-tick signal which may be used as the precise time or as reference signal to create a precise synchronous time.

In an embodiment of the invention, wherein the precision of said time synchronization is better than 50 µsec.

In an embodiment of the invention, the at least one data processor of a wind turbine and at least one data processor of a substation are mutually time synchronized. In an embodiment of the invention the accuracy of the time stamp of the time stamped event is better than 500 µs preferably better than 200 µs more preferably better than 10 µs and most preferably better than 2 µs.

The accuracy of the time stamped events depends, among other things, on where in the processing of the event the time stamp is made. The following may have influence on the precision or speed of a time stamp the data processor, the precision of the synchronized clock, operative system, uncertainty in the CPU (CPU; Central Processing Unit) of the data processor or any other possible latency in the data processor. When the time stamp on the events is very accurate e.g. 1 µs or better it will be possible to monitor the origin and distribution of e.g. a short circuit very precise in a wind power plant or inside a single wind turbine a short circuit as mentioned can e.g. be generated by a lightning.

By precision is to be understood the understanding of time between data processors in a network, this is also sometimes referred to as jitter. Jitter is a determining factor e.g. for the simultaneity of samplings, measurements and activating of data and especially in relation to synchronizing of physical separated nodes in a network. The better the precision, the more applications.

Jitter may be interpreted as an unwanted variation of one or more characteristics of a periodic signals e.g. in electronics. Jitter may be seen in characteristics such as the interval between successive pulses, or the amplitude, frequency or phase of successive cycles. In other words jitter may be interpreted as an expression related to the precision of e.g. time between two clocks.

In an advantageous embodiment of the invention event data describing event enters e.g. a data processor or means controlled by the data processor in a wind power plant e.g. as a telegram, packet, string, serial data stream or any combination thereof. A time stamp is attached to the event data.

In an advantageous embodiment of the invention an accurate time stamp is made by means of software or hardware.

In an advantageous embodiment of the invention a clock is generated by means of a signal from an earth satellite system such as e.g. one or more GPS satellite. Said signal from one or more GPS satellites may be a 1 pulse pr second the wind power plant WPP is synchronized up against these pulses from one or more GPS satellites.

In an advantageous embodiment of the invention said time stamp is made independent of clock and latencies in hardware, software and operative system.

In an embodiment of the invention said time stamp is a hardware time stamp.

In an embodiment of the invention hardware time stamping of events are used for time synchronization purposes.

In an advantageous embodiment of the invention the time stamp is given to a data packet as soon as the event enters the data processor. This may be done by time stamping the data packet in the physical layer of e.g. the OSI model (OSI; Open Systems Interconnection) or other protocols to avoid latency throughout the rest of the layers of the protocols. Latency in the layers of e.g. the OSI model may occur if the CPU in the data processor receives an interrupt during processing of the data packet, in this situation a latency of unknown length occurs which brings uncertainty to the time stamp.

According to an advantageous embodiment of the invention the event data is time stamp as soon as possible when the event data is received e.g. from a sensor. Hence the time stamp may be added to the event data already at an input port e.g. where a signal cable is connected to a control system, an interface e.g. between wireless communication devices, etc.

In an embodiment of the invention said hardware timestamp is performed by means of a counter In an advantageous embodiment of the invention the time stamp is made by means of a counter which counts relative to the synchronized clock in the data processor. The time stamp is in this embodiment just a number given to the data packet. This number may be interpreted later on in the data processor and if necessary the number is converted to the correct time of the arrival at the data processor.

According to a further embodiment of the invention, the time stamp is made by a FPGA (FPGA; Field Programmable Gate Array), microprocessor or other hardware data processing units.

In an embodiment of the invention said time stamp is a software time stamp by a dedicated controller.

In an advantageous embodiment of the invention the time stamp is made by means of a dedicated controller whose clock is synchronized to the rest of the data processors in the wind power plant.

In an advantageous embodiment of the invention at least one of the layers of the communication protocol is modified to time stamp the data packet according to the required accuracy of the system.

According to an advantageous embodiment of the invention, the time stamp is made by a dedicated processor, which can not be interrupted and thereby using time for processing other jobs.

In an embodiment of the invention said software time stamp is performed by means of a dedicated controller.

According to an advantageous embodiment of the invention the dedicated controller having a predictive and sufficient accuracy due to the fact that the controller is either completely dedicated to the purpose of time stamping or at least that the software-implemented time-stamping has the desired precision.

In an embodiment of the invention software time stamping of events is used for time synchronization purposes.

Software time stamping may e.g. be performed by means of a dedicated controller or at least a controller having a predictive and sufficient accuracy due to the fact that the controller is either completely dedicated to the purpose of time stamping or at least that the software-implemented time-stamping has the desired precision.

In an embodiment of the invention an event can be understood as any normal, abnormal, irregular occurrence in a wind power plant or any measurement, runtime measurements, interpreted measurements or any information derived or concluded thereof and represented as single samples streams thereof.

In an advantageous embodiment of the invention a measurement may e.g. be the measuring of voltages, current, power, phase-angle, power harmonics, turbine loads, wind speed, wind direction, vibration, pitch angles, temperature of parts of the wind power plant, threshold values, any interpreted, derived or calculated values required or any metrological information available or any combination thereof.

In an embodiment of the invention said event data is stored in a buffer before transferred to permanent storing means.

In an advantageous embodiment of the invention said buffer stores event data as the event data is received by the data processor.

In an advantageous embodiment of the invention said buffer transfers event data to more permanent storing means e.g. with predetermined time interval's, when trigged by an event or from an external or internal central data processor.

In an advantageous embodiment of the invention said buffer has the capacity to store event data for one day, or even one week before transferring event data to more permanent storing means.

In an embodiment of the invention the wind power plant is controlled at least partly by means of predictive control on basis of the said time synchronization In an advantageous embodiment of the invention the time synchronization allows a predictive control of the wind power plant, this can be very advantageous e.g. when a wind power plant have to shut down. If all wind turbine in a wind power plant are shut down at the same time this can lead to disturbances on the utility grid where to the wind power plant is connected. Because of the precise time synchronization of all data processors in the wind power plant it is possible to shut down each wind turbine at the most optimal time compared to the voltage and current in the utility grid.

The event trigging the shut down of the wind power plant may e.g. be an external signal or internal signals e.g. from a metrological station.

In an advantageous embodiment of the invention the predictive control can be use to synchronize the aviation light warning e.g. aeroplanes of the danger of a wind turbine.

Moreover, the invention relates to a wind power plant comprising at least two wind turbines wherein the wind power system performs the method according to any of the claims 1-31.

Furthermore, the invention relates to use of time synchronization for error detection in a wind power system comprising at least two different data processors.

When all data processors in accordance with an embodiment of the invention are synchronized, it is possible to perform a very advantageous analysis and comparison of specific errors of the wind power system. When the events, e.g. a similar specific error detected in e.g. several wind turbines at different points of time, it is possible to perform a mapping of the origin and the distribution routes of specific error cases advantageously by means of mutual comparison.

Furthermore the invention relates to the use of time synchronization for error detection in a wind power system according to claim 33, wherein said time synchronization is performed in accordance with the method according to any of the claims 1-31.

Moreover, the invention relates to use of time synchronization for performance analysis in a wind power system comprising at least two different data processors.

By means of the synchronizing of the different data processors DPE of the wind power system it is possible to compare the different event of the different data processors and detect the origin of comparable events. This provides an improved detail level of e.g. collected statistics which may be utilized for energy optimization, error detection, precautionary actions etc.

Moreover, the invention relates to the use of time synchronization for performance analysis in a wind power system according to claim 33, wherein said time synchronization is performed in accordance with the method according to any of the claims 1-31.

Moreover, the invention relates to the use of time synchronization for optimizing power control in a wind power system.

Moreover, the invention relates to the use of hardware time stamping of events for time synchronization purposes according to any of the claims 33-37.

Moreover, the invention relates to the use of software time stamping of events for time synchronization purposes according to any of the claims 33-37.

Moreover, the invention relates to analyzing events of or controlling at least part of a wind power system comprising at least two data processors, said method comprising the steps of:

mutually synchronizing the data processors of said wind power system according to a synchronized time,
registering said events,
time stamping said registered events, and
performing analysis of events or control of at least part of the wind power system based on said registered and time stamped events.

In an embodiment of the invention said time synchronization enables defining a set-point in the time domain; said set-point is a global set-point common in respect of all synchronized data processors.

According to an advantageous embodiment of the invention the set-point is a global reference given to registered event. Hence a set-point may be the time an event is first registered in a data processor in the wind power system, the time of the time stamp provided to a registered event. This time may be used as a set-point for analysing of e.g. performance distribution route of a fault or control of at least part of the wind power system.

It should be noted that more than one set-point may be defined.

In an embodiment of the invention said wind power system is at least partly controlled in relation to said set-point.

In an embodiment of the invention at least part of the elements of a said wind power system is equipped with at least one earth satellite system receiver, such as a GPS receiver.

According to an advantageous embodiment of the invention the wind turbines, substations or other elements of a wind power system is equipped with at least one earth satellite system receiver. This is very advantageous is the time synchronization is done by means of an earth satellite system.

Moreover, the invention relates to a wind power system, comprising at least two data processors, said wind power system furthermore comprising a master clock:

said at least two data processors each comprising a slave clock, means for synchronizing said slave clock of each of said at least two data processors according to said master clock, one or more sensors for registering one or more events, occurring in said wind power system, means for creating one or more event data based on said one or more registered events, means for time stamping, in said at least two data processors, of said one or more event data, in accordance with said slave clock, means for analysing the said event based on said time stamped event data or means for controlling at least part of said wind power system based on said time stamped event data.

According to an advantageous embodiment of the invention one of the data processors in the wind power system may be chosen to comprise the master clock. Hence according to such embodiment not all of the data processors comprises a slave clock.

In an embodiment of the invention said means for time stamping is hardware means.

According to an advantageous embodiment of the invention the event data is time stamp as soon as possible when the event data is received e.g. from a sensor. Hence the time stamp may be added to the event data already at an input port e.g. connected to a data processor, logic circuit, a control system, an interface e.g. between wireless communication devices, etc.

In an embodiment of the invention said means for time stamping is a dedicated processor In an embodiment of the invention a wind power park comprise two or more elements of a wind power system.

Moreover the invention relates to a method for obtaining synchronous time in at least two data processors in a wind power system, said method comprising the steps of:

establishing a reference signal, establishing a common notion of said reference single in said at least two data processors so that the time domain in said at least two data processors in said wind power system becomes synchronous, said synchronous time domain is established by means of broadcasting said precise reference signal among said at least two data processors in said wind power system, and wherein jitter between said at least two data processors is less than ±100 μsec According to an advanced embodiment of the invention some event requires a high precision e.g. better than 100 μsec to be reliable or to be able to analyse such events. Such events could e.g. be vibrations or fault distribution in a wind power system.

In an embodiment of the invention said data processor may be a microprocessor, logic circuits, microcontroller, CPLD (CPLD; Complex Programmable Logic Device), FPGA (FPGA; Field-Programmable Gate Array), ASIC (ASIC; Application Specific Integrated Circuit) or any other means capable of processing data.

In an embodiment of the invention said time stamping may be performed indirect by means of a synchronous data processor or logic armed to sample/measure.

According to an advantageous embodiment of the invention the armed data retrieval may be performed in both the input step/sensor interface in said controller or in said sensor According to an advantageous embodiment of the invention it may be advantageous to be able to, on forehand, determined when a sample or measurement is to be made.

THE DRAWINGS

Figure 2:
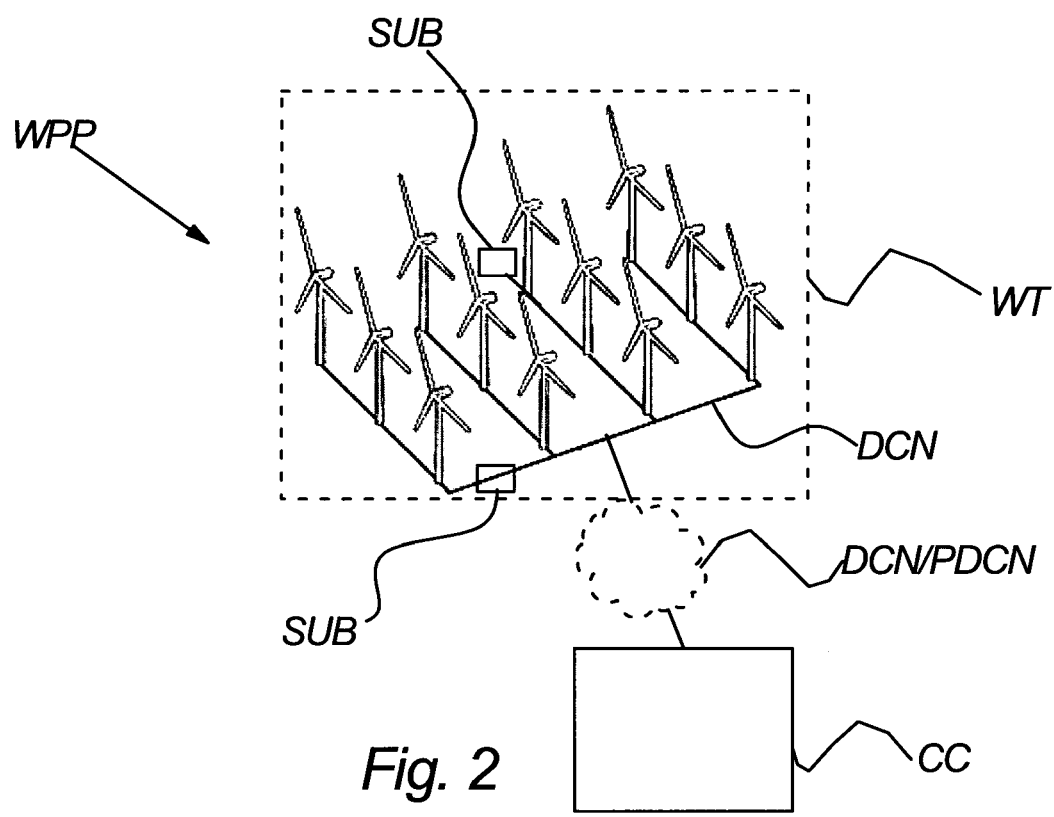
Figure 3A:
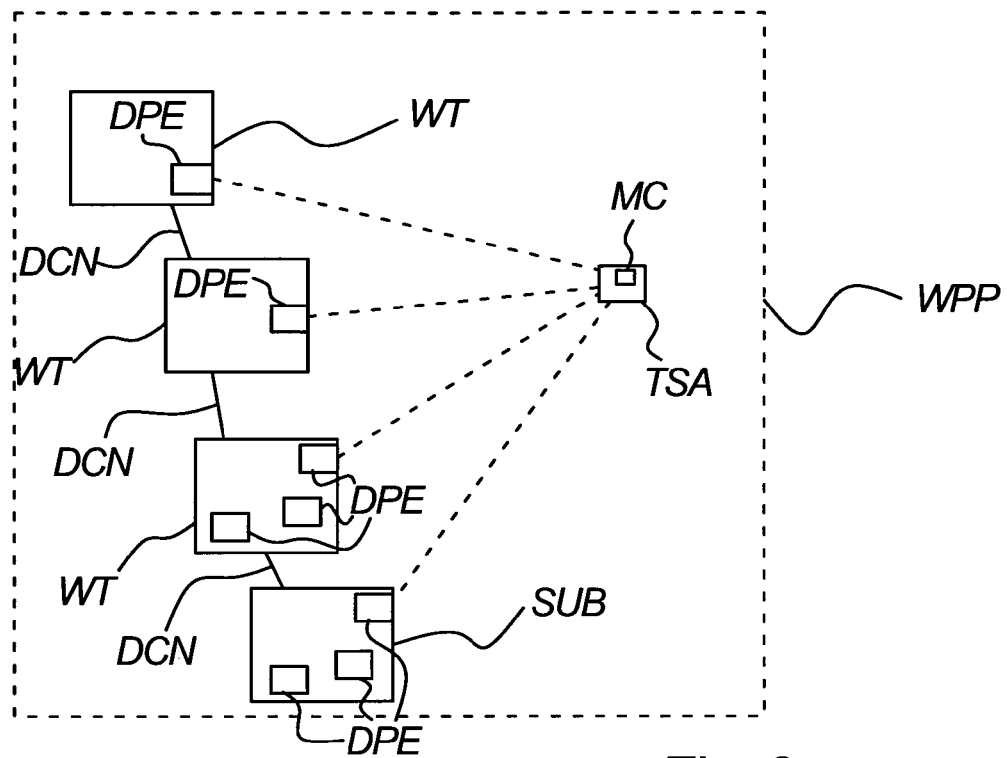
Figure 3B:
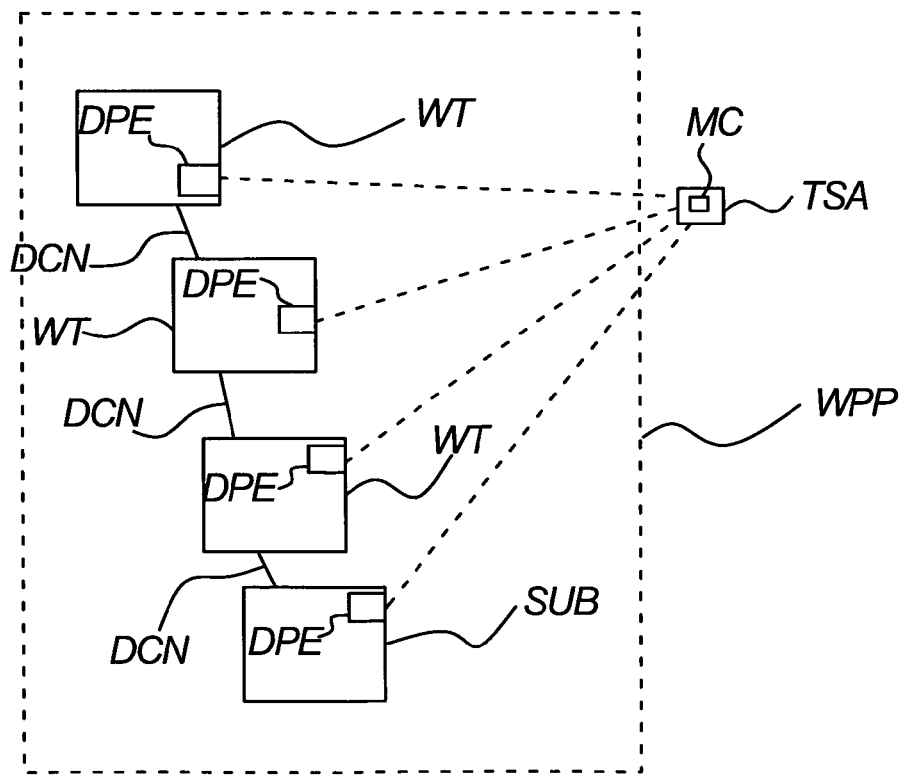
Figure 4:
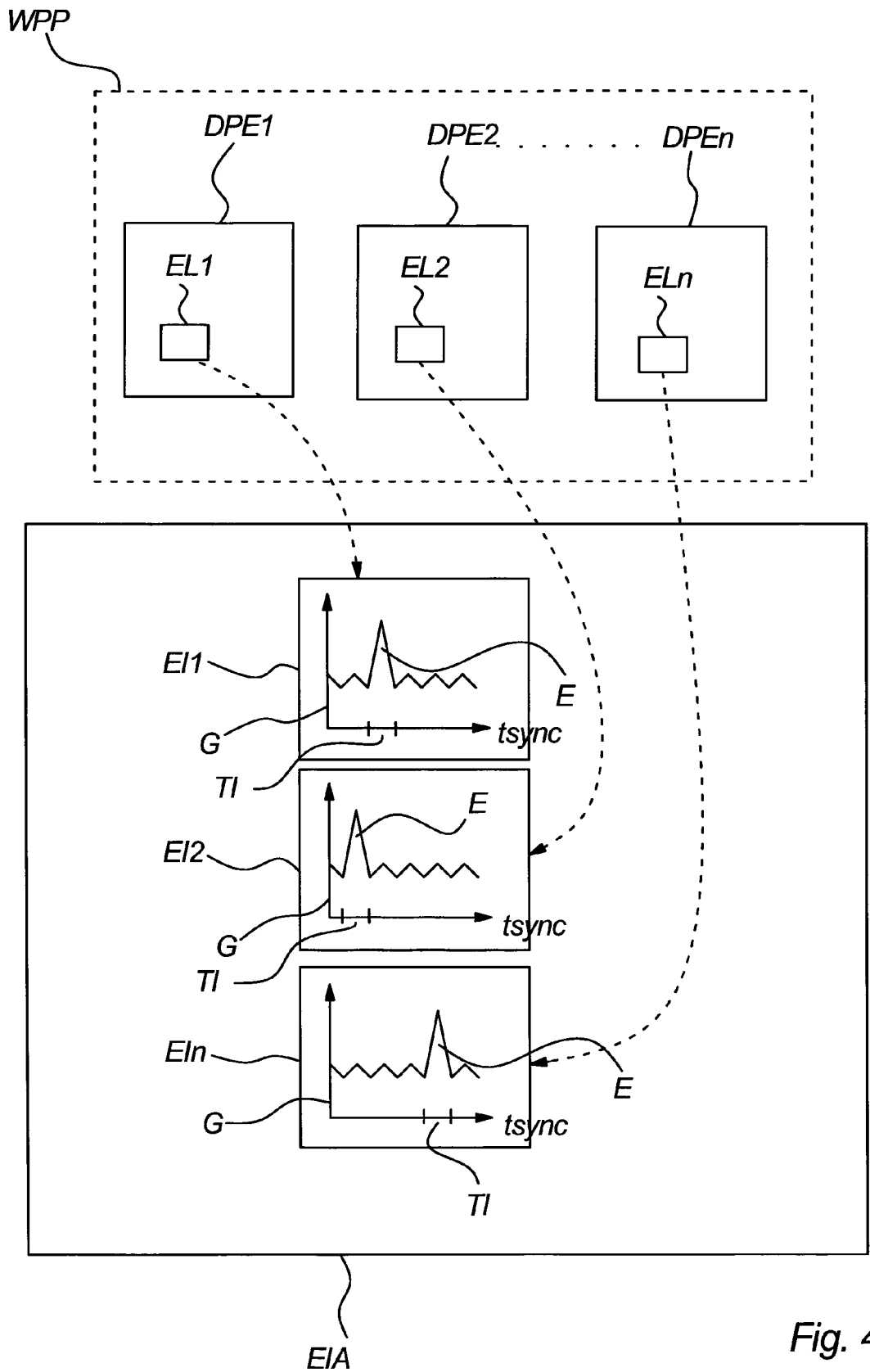
Figure 5:
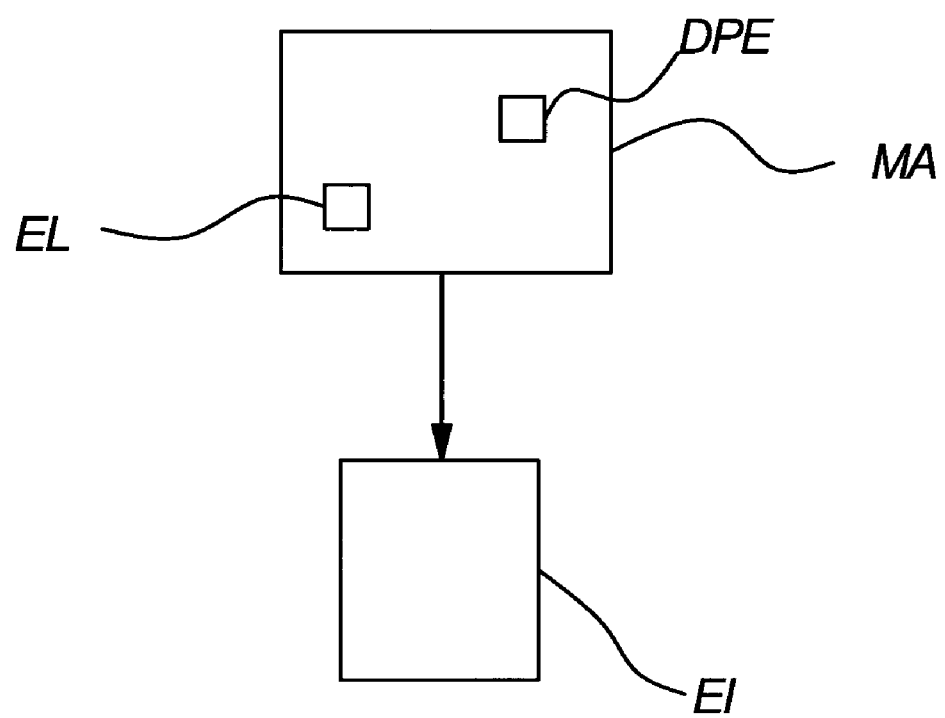
Figure 6A:
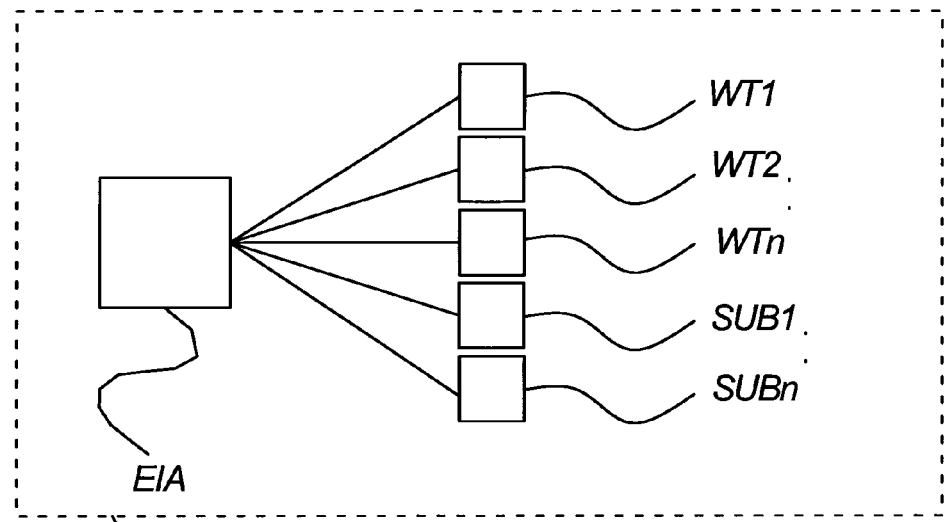
Figure 6B:
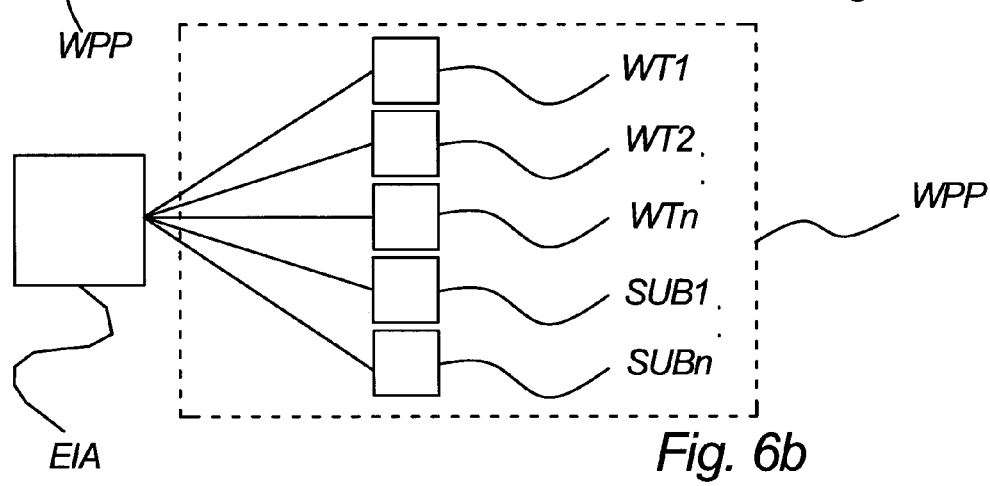
Figure 6C:
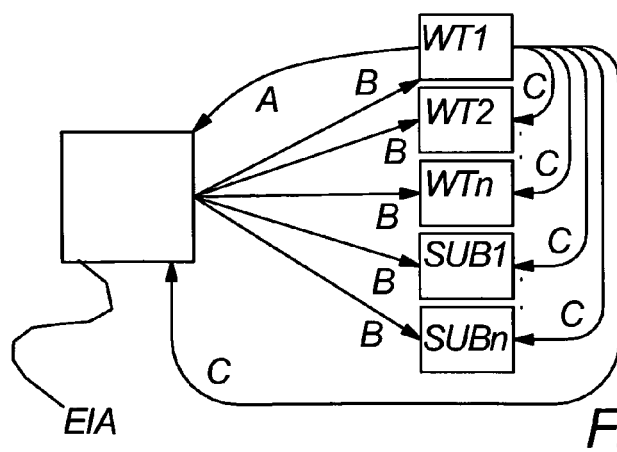
Figure 7:
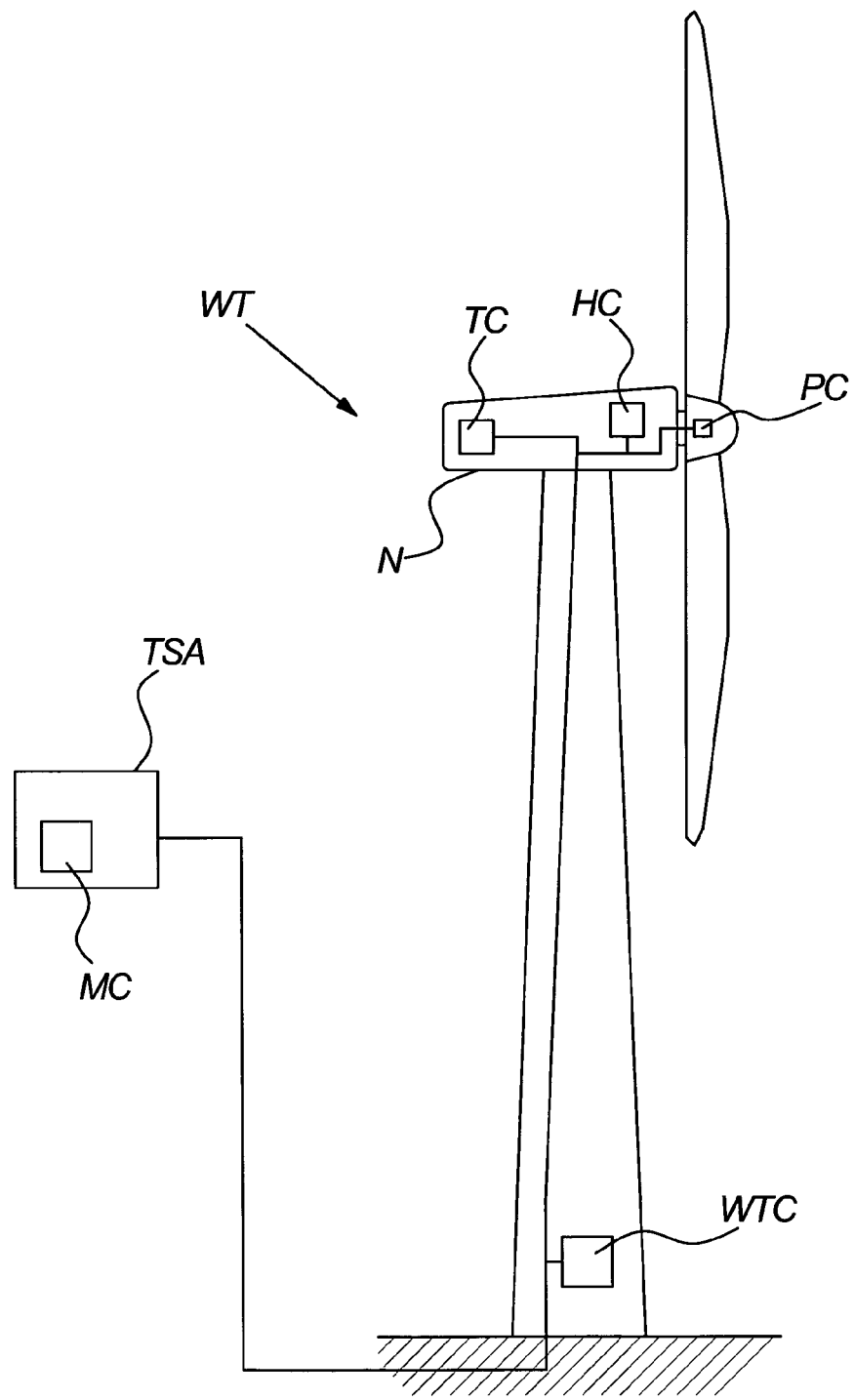
Figure 8:
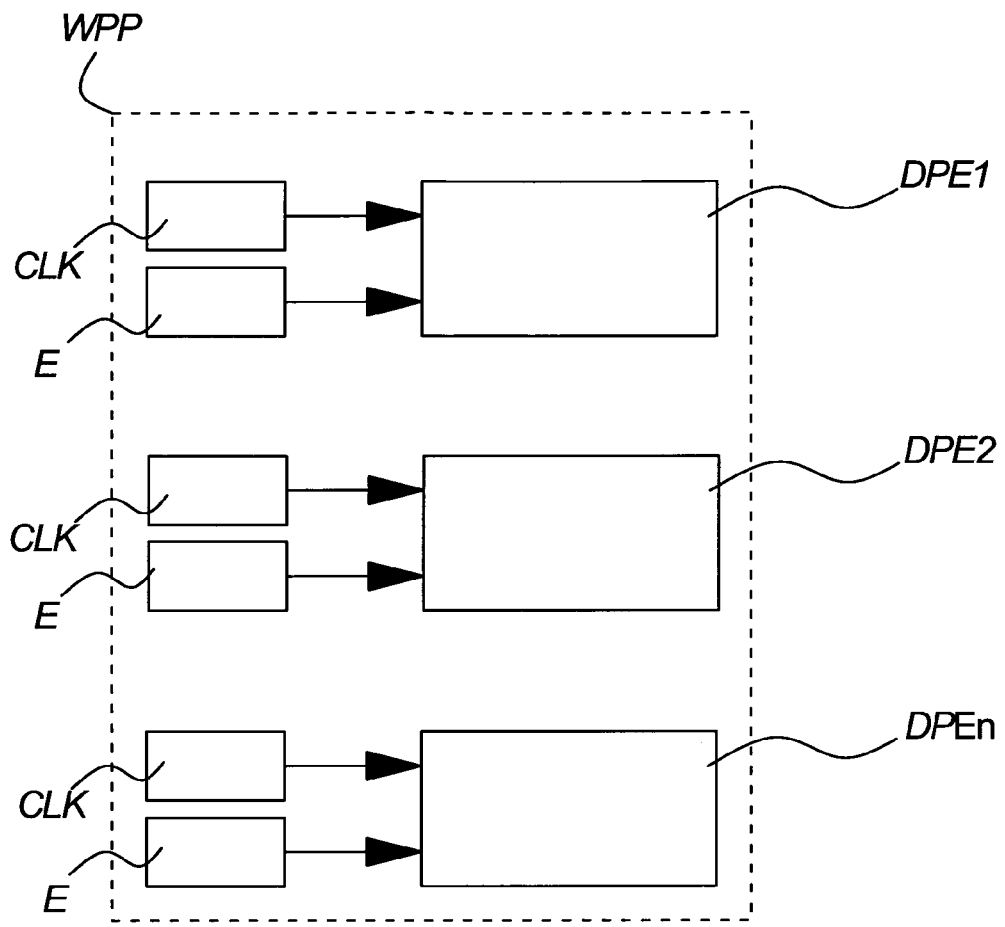
Figure 9:
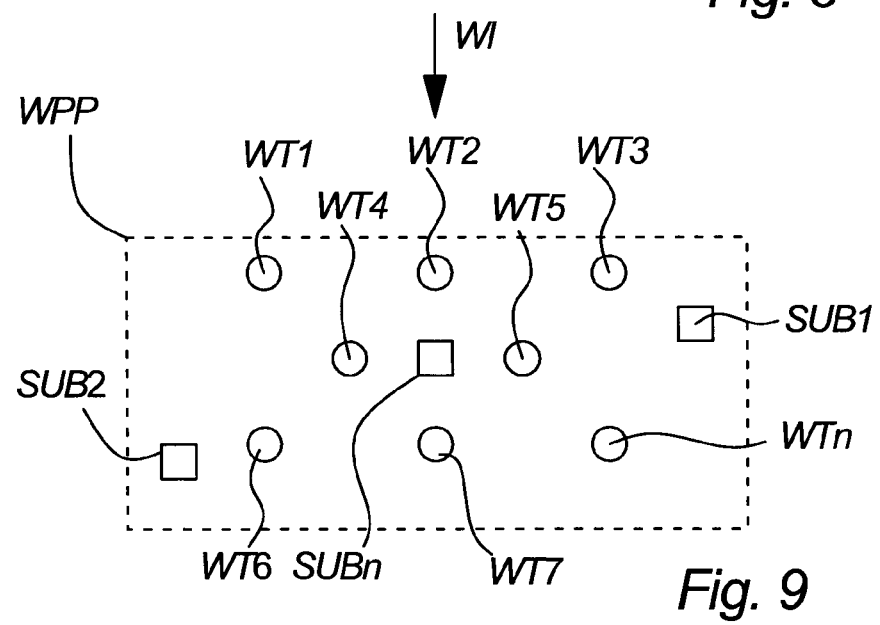
Figure 10A:
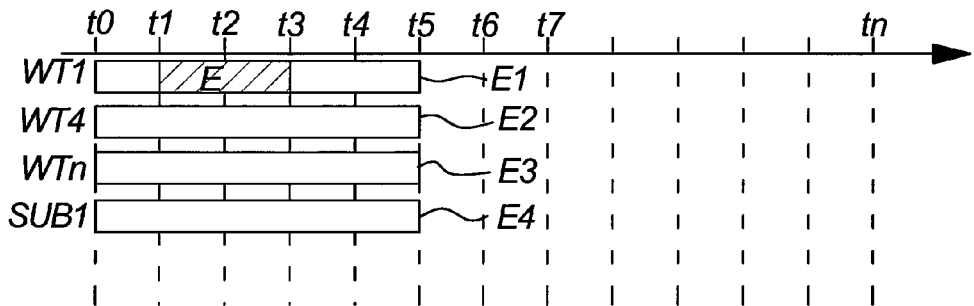
Figure 10B:
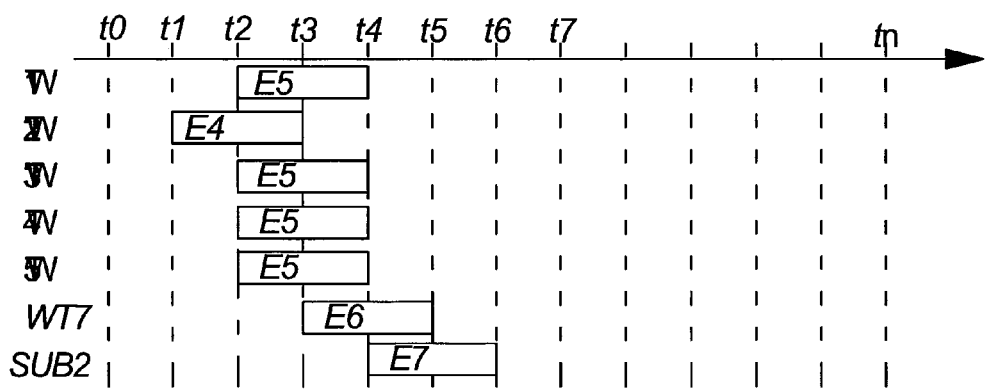
Figure 10C:
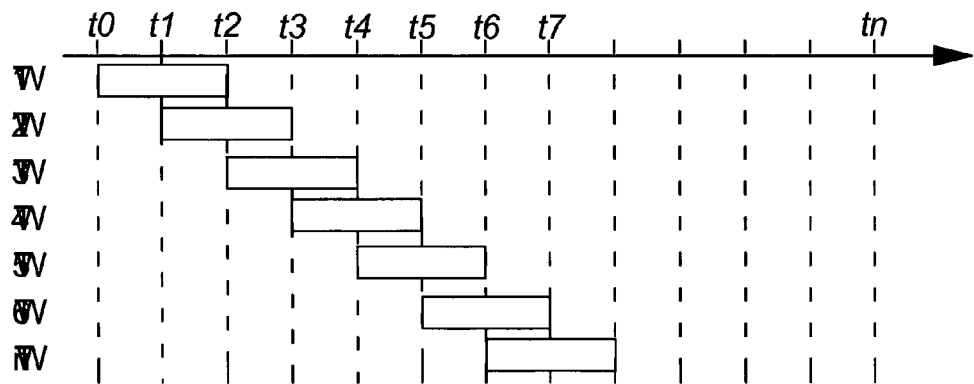
Figure 11:
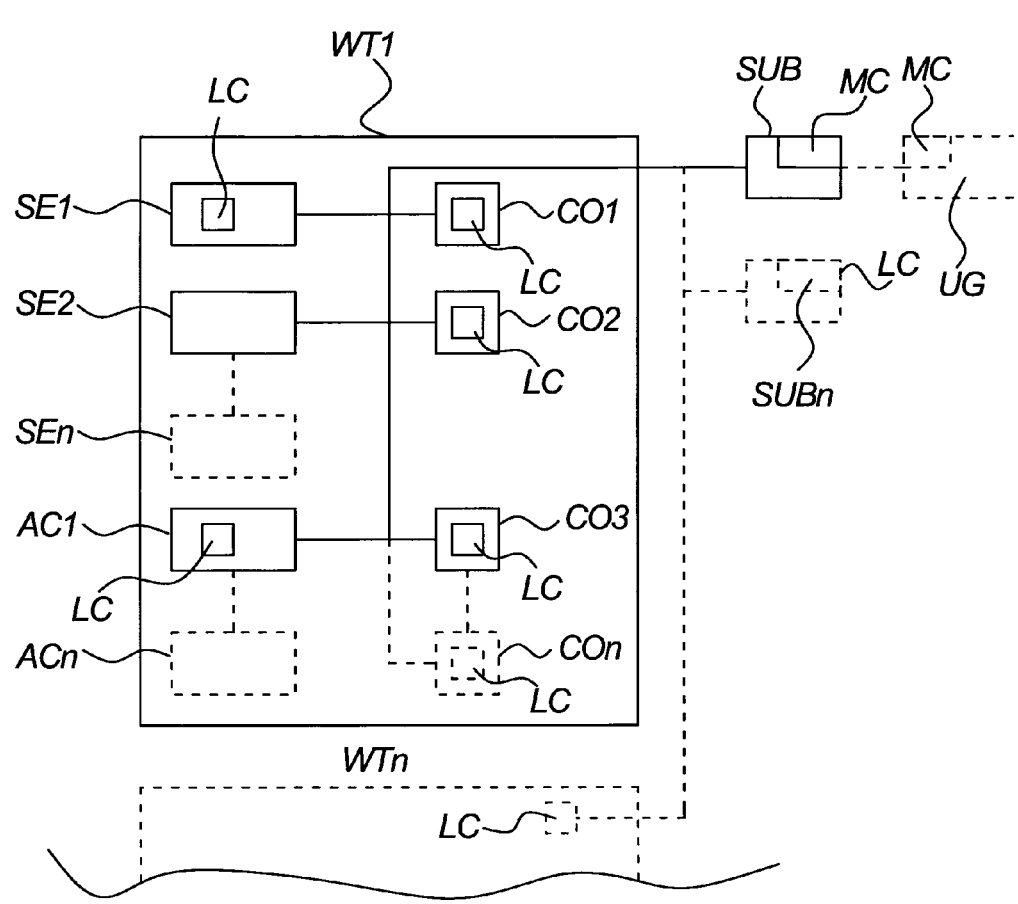
Figure 12A:
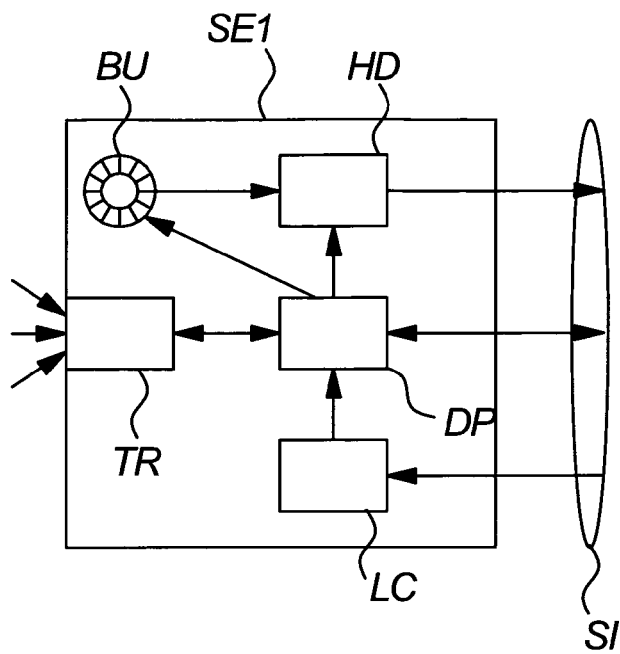
Figure 12B:
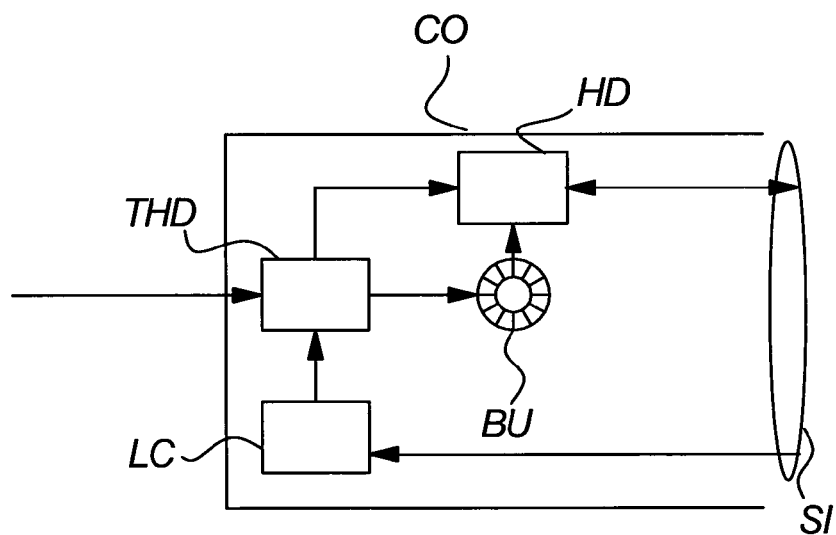

The invention will be described in the following with reference to the figures in which FIG. 1 illustrates a large modern wind turbine as seen from the front, FIG. 2 illustrates an overview of a typical wind power plant, FIG. 3a illustrates a wind power plant according to an embodiment of the invention, FIG. 3b illustrates a wind power plant according to a further embodiment of the invention, FIG. 4 illustrates an example or application of event information within the scope of the invention, FIG. 5 illustrates the functionality of a registering arrangement of a wind turbine within the scope of the invention, FIGS. 6A, 6B and 6C illustrates different arrangements of the event information analyzer within the scope of the invention and communication within the wind power plant WPP, FIG. 7 illustrates a wind turbine WT with different internal data processors DPE in accordance with an embodiment of the invention, FIG. 8 illustrates a block diagram of communication between clock CLK, event E and data processors DPE in a wind power plant WPP, FIG. 9 illustrates the location of wind turbines WT and substations SUB in a wind power plant WPP, FIG. 10a illustrates a sequence diagram of event in a wind power plant WPP as a result of a wind gust hitting one of the wind turbine WT, FIG. 10b illustrates a sequence diagram of event in a wind power plant WPP as result of a wind turbine WT struck by lightning, FIG. 10c illustrates a sequence diagram of the shut down of a wind power plant WPP, FIG. 11 illustrates a schematic description of the data communication in part of a wind power system, FIG. 12A illustrates an example of data entering a measuring unit, and wherein, FIG. 12B illustrates an example of data entering a control unit.

DETAILED DESCRIPTION

The term "data processor" DP can be understood as a controller or as part of a controller e.g. a controller in measurement equipment for measuring or monitoring on e.g. transformers, lightning and power or controller for controlling parts of a wind turbine WT, substations SUB, etc. Furthermore a data processor may be understood as part of or as a microprocessor, logic circuits, microcontroller. CPLD (CPLD; Complex Programmable Logic Device), FPGA (FPGA; Field-Programmable Gate Array), ASIC (ASIC; Application Specific Integrated Circuit) or any other means capable of processing data.

Term "wind power plant" WPP is a term covering elements needed for a wind power plant WPP to produce energy such as a plurality of wind turbine WT, substation SUB, wind power plant WWP, external systems or any other units in connection with a wind turbine WT or wind power plant WPP.

The term "wind turbine" WT is a term covering everything which is used in relation to wind turbines such as gear, generator, converter, control units for controlling all parts of the wind turbine WT, etc.

The term "substation" SUB is a term covering everything included in a wind power plant WWP except for the wind turbines WT; hence the term substation SUB may cover control units and servers, metrological equipment, phase compensation equipment, transformers, etc.

The term "wind power system" covers elements within a wind power park WPP, wind turbine WT, substation SUB or any other element needed to produce energy from the wind. Furthermore "wind power system" should in one aspect be understood as covering a stand alone wind turbine WT or substation SUB and according to another aspect covering a wind power park WPP The term "time stamp" may be understood as information such as time, day and year given to e.g. the event log, data packet or telegram.

According to an embodiment the invention more than one data processor DPE are working based on the same precise global time (global, within the wind turbine system).

FIG. 1 illustrates a modern wind turbine 1. The wind turbine 1 comprises a tower 2 positioned on a foundation. A wind turbine nacelle 3 with a yaw mechanism is placed on top of the tower 2.

A low speed shaft extends out of the nacelle front and is connected with a wind turbine rotor through a wind turbine hub 4. The wind turbine rotor comprises at least one rotor blade e.g. three rotor blades 5 as illustrated.

FIG. 2 illustrates an overview of a typical wind power plant WPP, which is an example of a wind power system, according to an embodiment of the invention. A wind power plant WPP may in some contexts be referred to as wind parks or wind farms. A wind power plant WPP comprises a number of wind turbines WT located in the same area in a group onshore or offshore often spaces 500 meters apart. Furthermore the wind power plant WPP may include one or more substations SUB. The wind turbines may be assembled to constitute a total unified power producing unit that can be connected to the utility grid.

A wind power plant typically has a "master" or central controller CC. The central controller CC may, according to an embodiment of the invention, be located as part of or in relation to a SCADA (SCADA; Supervisory Control And Data Acquisition) server. The central controller CC may be related to a control station or substation SUB which may comprise a number of computers or processing units including data processors DPE.

The central controller CC may typically comprise means for continuously controlling and monitoring the condition of the wind turbines WT and substations SUB. Furthermore the central controller CC may collect data which may be used in statistics or analysis on operation and may at the same time send/receive control related data to and from elements of the wind power plant WPP.

The central controller CC may be connected to the data communication network of the wind power plant WPP locally or remotely via a data communication network DCN or a public data communication network PDCN, e.g. the internet. Control related data may be transmitted between elements in the wind power plant WPP via a data communication network DCN. The data communication network DCN within the wind power plant WPP may e.g. be a parallel, serial network implemented wireless or by means of optical or copper cables. Preferably the data communication network DCN may e.g. comprise a local area network LAN or WLAN and/or e.g. a part of a public data connection network, such as e.g. the internet or an intranet, The control related data may typically be data to control a wind turbine WT or substation SUB. The control related data may be instructions to a given wind turbine WT e.g. to change the set-point of produced power.

The data communication network DCN may also be utilized for transmitting monitoring data e.g. within a wind power plant WPP between substations SUB, wind turbines WT, controller units etc. or to and from the central controller CC etc., if the central controller CC is not included in the wind power plant WPP. Such monitoring data may e.g. be a reading of a pressure meter of a valve of the wind turbine, temperature, vibrations, wind speed, output of the individual wind turbines WT or any other measured data within a wind power plant WPP. The measurements may found basis e.g. for statistic-, analytic- or control purposes.

The expenses in relation to build a wired network between elements of a wind power plant WPP is relatively low, because the elements of the wind power plant WPP has to be connected with high voltage cables anyway. This is one argument that in an embodiment of the invention it is preferred to use data communication through data cables instead of wireless data communication. Another argument is that wireless communication today is too unstable to trust critical control data to wireless data network. In the future, wireless communication may be more stable and thereby be a good alternative to wired communication networks.

The present invention is preferably utilized within a wind power plant WPP, within one single wind turbine WT, within one substation SUB or any combination thereof.

FIG. 3a illustrates a simplified overview of a wind power plant WPP, which is an example of a wind power system, according to an embodiment of the invention. The figure illustrates a number of wind turbines WT and a substation SUB which may be interconnected via a data communication network DCN. Evidently, other equipment may be present in a wind power plant WPP as illustrated with reference to the description of FIG. 2. The wind turbines WT and substation SUB may comprise a plurality internal data processors DPE.

Wind power system WPS monitoring, control and regulation data may be correlated in the time domain. Over recent years the performed monitoring, control and regulation in wind power systems WPS have become increasingly more sophisticated and as a consequence the precision requirement to the temporal correlation of data has increased.

Temporal correlation of data between data processors in a wind power system WPS based on the timing provided by application software (firmware) is of significantly poorer precision than required in future wind power plants.

Application software employs the capabilities of a computer directly and thoroughly to a task that the user wishes to perform; one example could be a SCADA control and monitoring system. The precision (jitter) in a SCADA control and monitor system is often in the millisecond range e.g. between ±10 ms to ±100 ms.

A typical problem related to a wind power systems WPS such as a wind power plant WPP is that the internal clocks of the data processors PDE e.g. of the wind turbines WT and substations SUB may differ. In other words, an inaccurate time domain may occur in the data processors DPE of the elements of a wind power plant WPP, simply because the data processors DPE are not synchronized to a satisfying extent of precision, which makes the result of e.g. comparing and/or correlation of measuring data less precise.

The wind power plant WPP moreover comprises a time synchronization arrangement TSA to which the wind turbines WT, substations SUB and the other data processors DPE may be connected. This connection ensures that the data processors DPE of the wind power plant WPP are always synchronized in relation to a common time. The time synchronization arrangement TSA may comprise or be a part of a master clock MC.

The time synchronization arrangement TSA may specifically be implemented as a software or hardware implemented element which continuously communicates e.g. with the data processors DPE of the wind turbines WT or substations SUB to obtain a time synchronization of a desired precision. Such time synchronization may also be referred to as a "precision time" or "precision global time" with global referring to the whole wind power system. The expressions "precision time" and "precision global time" indicate that the synchronized time which at least part of the data processors in the wind turbine system is related to is related to the time domain. Hence, an event occurring at the same time e.g. in different wind turbines WT is registered in the respective wind turbines WT and obtains an identical time stamp.

Each wind turbine WT may include several data processors DPE as illustrated on FIG. 3a. The different data processors DPE illustrated in FIG. 3a could e.g. comprised of be part of a wind turbine controller WTC, a top controller TC, a hub controller HC, pitch controller PC, but also all other sorts of data processors located in a wind turbine WT, substation SUB or wind power plant WPP.

As illustrated in FIG. 3a one or more substation SUB in a wind power plant WPP may comprise more than one data processor DPE. The different data processors DPE illustrated in the substation SUB in FIG. 3a may e.g. be a transformer controller, a converter controller, a filter controller, different kinds of monitoring units, etc. but also all other sorts of data processors located in e.g. a substation SUB.

When the desired number of data processors DPE of the wind power plant WPP in accordance with an embodiment of the invention is synchronized e.g. having a common understanding of the precision time, it is possible to perform a very advantageous analysis and comparison of specific events of the wind turbines. When the events, e.g. the same specific error is detected in several wind turbines WT at different points in time, it may be possible to perform a mapping of the origin and/or the distribution route of such events, advantageously by means of mutual comparison. Another example is simultaneous sampling of data in physically separated/independent nodes (e.g. a data processor DPE, measuring or activating devices, etc.) e.g. within a wind turbine WT. If e.g. a number of accelerometers or microphones are measuring vibration data on a physical structure, these measurements could found basis for advanced vibration analysis.

One way of utilizing the measurements is in relation to control of the wind turbine WT.

In an embodiment of the invention one parameter may be measured by more than one measuring arrangement e.g. three measuring arrangements. If the second or midmost of these measuring arrangements, e.g. measuring vibrations at different locations on an axis, fails to deliver measurements then measurements from the first and third measuring arrangement may be used to reproduce the missing measurements. This can be done because knowledge of the exact time of the measurements of the first and third measuring arrangement is available and the knowledge that these measurements are made synchronous.

Furthermore, it may be possible to reproduce the missing measurements from information of e.g. the physical location of the second measuring arrangement, synchronized measurements from measuring arrangements located on components with relation to the axis, etc. By calculating or comparing different measurements combined with information of location of other measuring arrangements, it may be possible at least temporary to replace the measurements from this second measuring arrangement which does not deliver measurements.

It should be noted that depending on the type of the missing measurements, these measurements may be reproduced based on various information from measurements from only one further measuring arrangement to a plurality of measuring arrangements.

Another way of utilizing the measurements from one or more measuring arrangements which synchronously obtain measurements is to compare these with incoming measurements from other parts of e.g. the wind turbine WT or even measurements from neighboring wind turbines WT. A wind turbine WT could at least partly be controlled by knowledge of e.g. the rotation speed of the hub or the quality of the output of the wind power plant.

Examples of events may e.g. by overvoltage, overcurrent, voltage or current deviating from sinus form, power harmonic, power phase, lightning, trip of switch, breaker, converter, VAR compensator etc.

In accordance with an embodiment of the invention, the time synchronization is established by using a global time by running a protocol e.g. IEEE-1588. Each wind turbine WT synchronizes with the global time, ensuring that the time in each wind turbine WT is exactly the same (or at least down to a few to μsec.).

It should be noted that a plurality of standards or protocols may be used to obtain a desired precision/synchronizing of the data processors DPE, and it may even be possible to develop a new protocol for this specific purpose. Besides the already mentioned IEEE15888 other already known protocols may be advantageous to use, or to base further development of new time synchronizing protocols on, in relation to time synchronizing of data processors. Such protocols could e.g. include the IEEE1588 with wireless protocol extensions, NTP (NTP; Network Time Protocol), SNTP (SNTP; Simple Network Time Protocol), etc.

Furthermore, it should be mentioned that many industrial real-time LAN protocols can be supported by a precision time such as e.g. POWERLINK™, EtherCAT™, ProfiNET™, etc.

Furthermore, it should be mentioned that many industrial real-time field-bus systems can be supported by a precision time such as e.g. ProfiBUS™, TTCAN™, ControlNet™, etc.

It should be noted that some of the above-mentioned protocols or standards are proprietary.

FIG. 3b illustrates a wind power plant WPP according to a further embodiment of the invention.

The figure illustrates another embodiment of the invention, wherein the time synchronization arrangement TSA is located externally with reference to the wind power plant WPP.

The elements of the wind power plant WPP may according to this embodiment of the invention communicate with external sources such as an earth satellite system e.g. a GPS (GPS; Global Positioning System) or an external control units In this further embodiment of the invention the synchronization of time between the data processors DPE of the elements of the wind power plant WPP are established by synchronizing the internal time of these data processors with an external time synchronization arrangement TSA, which is independent of the wind power plant WPP time.

It should be noted that it may not be relevant to synchronize all data processors DPE of e.g. a wind turbine WT or substation SUB.

The time synchronization arrangement TSA may comprise or be a part of a master clock MC.

Having a synchronized "wind power plant WPP time" may be one way of optimizing the a wind power plant WPP because it enables the control system of the wind power plant WPP to get at synchronous set-point in each element of the wind power plant WPP. Such synchronous set-point facilitates a simultaneity in the time domain, and if this is not facilitated a degree of uncertainty appears in the time domain which makes some regulations or controlling inaccurate.

If the majority of elements included in a wind power plant WPP is at least partly equipped with synchronized data processors, it may be possible to perform park-wide control or park-wide analysis.

The analysis could e.g. be on performance of the individual wind turbines in relation to e.g. neighbouring wind turbines WT. Such analysis may be used to optimize the total performance of a wind power plant WPP. Furthermore, it would be possible to get park-wide pictures of e.g. performance, wind, power quality, etc. based on the synchronous precise time.

Example of the park-wide control could be relevant in shut-down or start-up situations. If a wind power plant WT has to be connected to the utility grid it may be advantageous to do so at the right "moment". Such "moment" could e.g. be when the generator has reached its synchronous speed. In the same way, when coupling a wind turbine WT to the rest of the wind power plant WPP, it would also be preferred to be able to do so at the right moment.

It may be very advantageous to be able to perform park-wide control of wind turbines WT and/or substations SUB, because it could reduce the need for data processing equipment in the individual elements of the wind power plant WPP. This would especially be advantageous in large wind power plants WPP.

Within a single wind turbine it may also be advantageous to have a precise time or synchronized clock e.g. when measuring vibrations. If e.g. four accelerometers are measuring vibrations at four different locations on an axis, it would be possible to map a vibration through out the axis, perform condition monitoring systems analysis, etc.

FIG. 4 illustrates a non-limiting example of use of the events E measured in relation to the synchronized data processors DPE. FIG. 4 illustrates an example of the interaction between the elements of a wind power system such as a wind power plant WPP and an event information analyzer EIA.

The data processors DPE1, DPE2, ..., DPEn is part of one or more elements of a wind power plant WPP e.g. part of one or more wind turbines WT (not illustrated). The data processors DPE1, DPE2, ..., DPEn may be connected to one or more event logging elements EL1, EL2, ..., EL3 logging all or some of the events E occurring in relation to the element of the wind power plant WPP, to which the data processors DPE1, DPE2, ..., DPEn are connected. The event logging elements EL1, EL2, ..., ELn log the events E and register the events E together with a time stamp.

An event may e.g. be a fault, a stop of the data processor, a start, a change in the produced power of a wind turbine WT, error detection, detection of a lightning strike, detection of a wind gusts etc.

The event logging elements EL1, EL2, ..., ELn or another element is transmitting event information EI to the event information analyzer EIA.

The event logging elements EL1, EL2, ..., ELn related to the data processors DPE1, DPE2, ..., DPEn are directly or indirectly connected to the event information analyzer EIA which is able to perform an advantageous comparison of the events E due to the advantageous mutual time synchronization of the invention.

As illustrated, the event logging elements EL1, EL2, ..., ELn of the data processors DPE1, DPE2, ..., DPEn have according to this example logged an event E, e.g. originating from the same fault, illustrated as the peak of the graph G. Due to the time synchronization of the data processors the event information analyzer EIA is able to compare the three graphs G, not effected by the time the event is received in the event information analyzer EIA, and in that way e.g. determine the origin and the distribution route of the event E.

In this example event information 2 EI2 occurred prior to event information 1 EI1 even though the event information analyzer EIA did receive event information 1 EI1 before event information 2 EI2. It is possible for the event information analyzer EIA to conclude this by looking at the time stamp of the event from the different event logging elements EL1, EL2, ..., ELn. When the event information EI1, EI2, ..., EIn are analyzed in the event information analyzer EAI they are analyzed in relation to the common/synchronized time. The time of the x-axis of the graphs G, illustrating the events E registered in relation to the individual data processors DPE1, DPE2, ..., DPEn, is the mentioned common/synchronized time and by plotting the time stamped events E on the graphs G it is easy to get information e.g. on the origination or distribution route of a fault. In this example the fault originated in relation to data processor DPE2 and was shortly after measured in relation to data processor DPE1 and last measured in relation to data processor DPE3.

As illustrated, event information EI1-EIn is received by the event information analyzer EIA over a time interval TI. All data received by the event information analyzer EIA is temporary stored in a buffer, the capacity of said buffer has to be large enough to temporary store event information EI1-EIn as the event E is occurring. Furthermore the buffer has to have capacity to temporary store the event E until the event E has ended with a possible transmission delay on the network between different data processors DPE.

It should be noted that an event E may both refer to an event E having a certain time duration described by a number of samples or to the sample itself.

In one embodiment of the invention all registered events E are time stamped and then placed in a buffer. If an event E in the wind power plant WPP is abnormal or irregular, no matter if it is in a substation SUB or wind turbine WT, a message is distributed to all data processors DPE in the wind power plant WPP requiring each data processor DPE to save the content of the buffer. In this way it is only the important data which is stored and thereby requirements to the storing facilities are lowered.

The buffer has to have a size large enough to contain event data from an event E proceeding over a time interval TI. The buffer has to have the capacity to contain event data in the period of time it takes for a data processor DPE to observe abnormalities, send a message to all the other data processors DPE about saving event data and in one embodiment of the invention also have the capacity to store all event data in real time.

In another embodiment of the invention event data is moved from the buffer to a more permanent storage even if no abnormal or irregular events occur. The saving of event data may then be trigged by e.g. a predetermined time or trigged from a central computer and the storing of the normal event data may be used for static or analytic purposes.

In another embodiment of the invention all registered event data may be saved for later statistic or analytic purpose. The event data may first be placed in the buffer and later moved to a more permanent storing facility or the event data may be stored directly in a more permanent storing facility.

The analysis performed in the event information analyzer EIA is only possible because of the synchronous time in the data processors DPE. If the certainty of fast and synchronous measurements were not present it was impossible to perform at least some of the mentioned analyses.

FIG. 5 illustrates a simplified view of a measuring arrangement MA which measures events E and time stamps events E.

The measuring arrangement MA may comprise one or more data processors DPE, event logging elements EL, software or electronics (not illustrated) which are necessary for measuring and time stamping of events E.

The measuring arrangement MA of e.g. a wind turbine WT may be an arrangement which is implemented within that wind turbine WT. The measuring arrangement MA may detect and/or register events E that occur in the wind turbine WT or elements of the wind power plant WPP.

It should be noted that according to an embodiment of the invention, one measuring arrangement MA may measure and time stamp events E from more than one element of a wind power park WPP. Furthermore, according to another embodiment of the invention, more than one measuring arrangements MA may be measuring and time stamping events E in relation to only one element of a wind power plant WPP.

The measuring arrangement MA may perform a timestamp of events E when they occur and/or are registered in the measuring arrangement MA. Due to the advantageous and accurate time synchronization according to an embodiment of the invention of a wind turbines WT, the event information EI produced by the different measuring arrangement MA of different wind turbines WT are comparable.

This is a very advantageous feature in accordance with an embodiment of the invention that the event information EI of different measuring arrangements MA is comparable.

The event information EI to be transmitted may e.g. be a more or less complete representation of the registered events, a filtered representation of the registered event or e.g. event information which has been analyzed or processed when registered in the individual wind turbines.

In should be noted that it is also possible to perform "armed samplings" in relation to one or more data processors DPE e.g. within a wind turbine WT. Because of the precise/synchronous time/clock in data processors DPE within the wind power system e.g. within the individual wind turbine WT, it may be advantageous to perform "armed sampling" with more than one data processor DPE. Such "armed samplings" could e.g. be analyzed or used as basis for controlling at least parts of a wind power system.

By the term "armed sampling" is understood a sampling/measurement of data at a predetermined time. Hence, because of the predetermined time of the sampling it may not be necessary to time stamp the samplings to have an optimal starting point for controlling, analyzing, etc. the sampled/measured events.

FIG. 6a illustrates another embodiment of the invention. Here, an event information analyzer EIA is connected to a number of wind turbines WT1, WT2, . . . , WTn and substations SUB1, . . . , SUBn. The event information arrangement EIA is as illustrated part of a wind power plant WPP. The wind power plant WPP is an example of a wind power system and the wind turbines WT1, WT2, . . . , WTn and substations SUB1, . . . , SUBn may comprise data processors DPE.

The event information analyzer may e.g. be a part of or connected to a SCADA server or another server or system element of the wind power plant WPP.

FIG. 6b illustrates another embodiment of the invention wherein the event information analyzer EIA is located remotely with reference to the wind power plant WPP.

The event information analyzer EIA may be connected with the wind power plant WPP via a global or public data communication network. The illustrated event information analyzer EIA may refer to several wind power plants WPP (not illustrated).

FIG. 6c illustrates an example of the communication between the event information analyzer EIA, the individual wind turbine WT1, WT2, . . . , WTn and substations SUB1, . . . , SUBn of FIGS. 6a and 6b. FIG. 6c does only illustrate two different ways of communication between elements of a wind power plant WPP, but several other ways of communication between elements located within or outside the wind power plant WPP is also possible.

In one embodiment of the invention an event occurs in or at wind turbine 1 WT1, which sends a message A to the event information analyzer EIA which then distribute a message B to the all the wind turbines WT and substations SUB. The message B from the event information analyzer EIA trigs the elements of the wind power plant WPP (wind turbines WT1, WT2, . . . , WTn and substations SUB1, . . . , SUBn) to save the content of the buffer comprising the registered data, as described in relation to FIG. 4.

In another embodiment of the invention an event is registered in wind turbine WT1, which then distributes message C to the event information analyzer EIA and simultaneously to the other wind turbine WT and substations SUB in the wind power plant WPP. The message C from the wind turbine WT1 trigs the rest of the elements of the wind power plant WPP to save the content of the buffer comprising registered data.

One way of implementing the functionality described in relation to FIG. 6a-c is that the mentioned buffer is a so called circular buffer.

FIG. 7 illustrates a wind turbine WT with different internal data processors DPE in accordance with an embodiment of the invention. The data processors DPE in this figure are exemplified by a wind turbine controller WTC, a top controller TC, a hub controller HC and a pitch controller PC. It should be noted that also other elements of the wind power plant WPP could be used in relation to the embodiment illustrated on this figure.

The hub controller HC is an example of a data processor DPE which comprises means for controlling the hub and the top controller TC is a unit which may control elements related to the nacelle N. Likewise is the pitch controller PC an example of a data processor DPE which comprises means for controlling the pitch mechanism of the wind turbine blades.

The wind turbine controller WTC, which is also an example of a data processor DPE, comprises a number of computers which continuously monitor the condition of the wind turbine WT and collect data for statistics on its operation. Moreover the wind turbine controller WTC controls a large number of devices of the wind turbine WT such as switches, pumps, valves etc. The wind turbine controllers WTC1, WTC2, . . . , WTCn may be located inside the corresponding wind turbines WT e.g. in the tower, the nacelle, etc. or it may be located outside the wind turbines WT.

Moreover, the figure illustrates a time synchronization arrangement TSA which is connected to the different data processors e.g. the top controller TC, the hub controller HC, the pitch controller PC and the wind turbine controller WTC. It should be noted that the connection as illustrated is only understood as one of many applicable connection embodiments.

The time synchronization arrangement TSA may comprise or be comprised by a master clock MC. Different types of master clocks may be referred to within the scope of the invention. The master clock may be a precision clock available to the wind turbines WT and it may be established internally or externally to the wind turbines WTR or the wind power plant WPP.

A "master" clock or reference signal could e.g. be one data processor DPE determined to be in or established in one wind turbine WT or substation SUB. Then the rest of the synchronized data processors in the wind power system would be "slaves" synchronized to this "master" clock by means of a precision time protocol such as the IEEE1588.

Alternatively hereto the "master" clock or reference signal could originate from outside of the wind power system e.g. from the control of a utility grid, communication networks outside the wind power system, satellites; etc.

By means of the synchronizing of the different data processors DPE of the wind turbine WT it is possible to compare the different event E of the different data processors and detect the origin of comparable events. It should be mentioned that the same event E may also be detected in a plurality of elements of the wind power plant WPP. This provides an improved detail level of e.g. collected statistics which may be utilized for energy optimization, error detection, precautionary actions etc.

It should be noted that the present invention may also be advantageous in relation to a stand-alone wind turbine WT.

FIG. 8 illustrates communication between the synchronized clock CLK, occurring events E and different data processors DPE1, DPE2, ..., DPEn. The different data processors DPE1, DPE2, ..., DPEn may e.g. be located in a wind turbine WT, substation SUB, wind power plant WWP, an external system or any other units in connection with a wind turbine WT or wind power plant WPP.

In the embodiment of the invention illustrated in FIG. 8 the data processors DPE1, DPE2, ..., DPEn are all part of the same wind turbine WT.

In another embodiment of the invention illustrated in FIG. 8 the data processors DPE1, DPE2, ..., DPEn are all part of different wind turbines WT or substations SUB inside or outside the wind power plant WPP.

Each of the different data processors DPE1, DPE2, ..., DPEn is connected to the synchronized clock CLK and each of the data processors DPE1, DPE2, ..., DPEn can receive events E.

The events E received by the data processor DPE1, DPE2, ..., DPEn may be time stamped with a precision better than 500 μs preferably better than 200 μs more preferably better than 10 μs and most preferably better than 2 μs. The synchronized clock CLK is responsible for the time stamp and therefore the time stamp can not be more precise than the synchronized clock CLK.

The synchronized clock CLK can e.g. be relative to a 1 pps (pps; pulse pr second) signal received e.g. from one or more GPS satellites, in this way the synchronized clock CLK can not be more precise than the signal from the GPS satellites. Another way to obtain a precise synchronic clock CLK is to connect all data processors DPE1, DPE2, ..., DPEn in the wind power plant WPP in a network and communicating between the individual data processors by use of e.g. the IEEE 1588 protocol.

Another way to obtain synchronizing of two or more data processors DPE in a wind power system, is to connect individual computers of a wind power system with dedicated electrical connections. Such dedicated electrical connection could according to an embodiment of the invention be a communication line between two or more data processors DPE, which is only used for the purpose of enabling a high precision time synchronization of the connected data processors DPE. The precision global time, also referred to as synchronous time or precise synchronous clock, could e.g. be distributed to data processors of a wind turbine WT or substation SUB using hardware supported global time protocol on the above-mentioned dedicated communication line or a communication network.

This could be achieved e.g. by an internal clock generator, time-tick signals e.g. originating from a source such as e.g. a data processor, tick generator, GPS or other earth satellite systems, etc.

Another way to obtain a precise time stamp is to have a counter relative to the synchronized clock CLK in each data processor DPE1, DPE2, ..., DPEn. When an event E is received by the data processor DPE1, DPE2, ..., DPEn a number from the counter is attached to the data packet comprising the event data, and this number is later in the processing of the data translated to a real time stamp.

FIG. 9 illustrates a part of a wind power plant WPP with wind turbines WT1, ..., WTn, substations SUB1, SUB2, ... SUBn and wind entering the wind power plant WPP as illustrated by the arrow WI.

Each data processor DPE in the wind power plant WPP may e.g. be connected to a FIFO-buffer (FIFO; First In First Out) and a more permanent data storage. All event data related to the data processors DPE of the individual wind turbines WT and substations SUB are time stamped and placed in the FIFO-buffer which has a capacity matching requirements to the wind power plant WPP. In one embodiment of the invention the FIFO-buffer has the capacity to contain events data received one hour or less back in time, in another embodiment of the invention the FIFO-buffer has the capacity to contain event data received one week or more back in time. When the buffer capacity is used the event data arrived first is overwritten by the event data arrived most recently. In one embodiment the buffer would only have capacity to store data in the time it takes for the wind turbine WT to distribute e.g. to other wind turbines WT that the content of the buffer has to be saved. Under normal conditions this would take a few seconds.

It should be noted that no matter how the event data is stored temporally, both an individual wind turbine WT, substations SUB or other control units may trig the more permanent storing of the event data.

FIG. 10a illustrates a sequence diagram where t1 to tn is time intervals, the part E of the block E1 is a period of time where an event E e.g. a wind gust hits wind turbine WT1. The event E trigs saving of the data represented as block E1 in WT1, which then may be used for analysis later. The blocks E2-E4 is a period of time in which registered data from other wind turbine WT and substations SUB in the wind power plant WPP is interesting for later analysis of which effect the wind gust on wind turbine WT1 has had to the rest of the wind power plant WPP.

In one embodiment of the invention at the time t1 a wind gust hits the wind turbine WT1 and at the time t3 the wind gust is gone.

The registered data in wind turbine WT1 from time t0 to t5, block E1, could be interesting for later analysis and for that reason the event data registered in this period of time may be moved from the buffer, describe under FIG. 4, to the more permanent data storage.

At the time of the wind gust t1 a data processor DPE in wind turbine WT1 sends out a message to all other data processors in the wind power plant WPP to move event data, from time t0 to t5, from the buffer to the more permanent data storage.

The blocks E1 to E4 illustrates event data and can comprise more than one type of data. In the embodiment illustrated on FIG. 10a the block E2 comprises information on several different event data such as e.g. current, voltage, phase angle and wind speed. The mentioned event data can be used for individual control of wind turbines WT and substations SUB, analyses and statistics and e.g. for monitoring the effect on wind turbines WT in the back of a wind power plant WPP when a wind gust hits a wind turbine WT in the front of the wind power plant WPP.

The monitoring of event data from wind turbines WT and substations SUB behind the wind turbine WT which was hit by e.g. a wind gust can in one embodiment of the invention be analyzed, so that next time a wind turbine WT in a wind power plant WPP is hit by a wind gust it may be possible to optimize the control of the other wind turbine WT and substations SUB to get the full profit of the energy in the wind gust.

FIG. 10b illustrates event data E5-E7 received in relation to data processors DPE in the wind turbines WT1 to WT5, WT7 and substation SUB2, before and after wind turbine WT2 is struck by a lightning. The blocks E4 to E7 illustrate registered event data and how the distribution of a fault in the wind Power plant WPP illustrated on FIG. 9 could be.

As illustrated by E4 the fault first appears in WT2 at time t1, at time t2 the fault is detected in WT1, WT3, WT4 and WT5 as indicated by blocks E5. The reason that the fault appears at the same time in WT1, WT3, WT4 and WT5 is that the physical location of these wind turbines WT1, WT3, WT4 and WT5 is the same distance from wind turbine WT2, where the fault or event E occurred. At time t3 the fault appears at wind turbine WT7 and at time t4 the fault is registered in substation SUB2. The delay in registration of the fault or event E in wind turbine WT7 and substation SUB2 is caused by the fact that the physical location of wind turbine WT7 and substation SUB2 is even further away from wind turbine WT2. The time for the fault/event E to travel from wind turbine WT2 to wind turbine WT7 and substation SUB2 is reflected in the later registration of the fault/event E in wind turbine WT7 and substation SUB2

Referring to FIG. 10b and distribution of fault occurred e.g. as a consequence of a cable fault or as a consequence of a stroke of a lightning the precision of the time t0 to tn is important to locate the origin of the fault.

The faster synchronized clock, the better resolution of the time stamp given to the event data and the more precise location of a fault and fault origin can be determined.

FIG. 10c illustrates a sequence diagram of the precise time of shut down of each individual wind turbine WT in a wind power plant WPP, when a wind power plant WPP has to be shut down according to one embodiment of the invention. It may be very advantageous to be able to perform a controllable shut down of a wind power park WPP e.g. to be able to minimize disturbances from the wind power park WPP which is sent to the utility grid.

In another interpretation of FIG. 10c the sequence diagram illustrates the precise time of turning on the individual wind turbine WT in a wind power part WPP, when a wind power plant WPP has to be turned on according to one embodiment of the invention. It may be very advantageous to be able to perform a controllable turn on of a wind power park WPP e.g. to be able to minimize disturbances from the wind power park WPP which is sent to the utility grid.

One of several examples of the use of the precise synchronized clock is described below.

In case of cable fault or lightning strikes a short may occur in a wind power plant WPP and it can be very advantageous to be able to determine the origin of the short in the wind power plant WPP. Knowing the origin of a short can e.g. be very useful in post event analyzes of the event and when the fault is to be corrected it is useful to know the origin in a wind power plant WPP of e.g. 50 wind turbines WT.

Wind turbines WT and substations SUB in a wind power plant WPP may be electrical connected by means of under ground cables comprising a metal conductor e.g. aluminum or cobber.

If the accuracy of the synchronized clock is e.g. 2 μs it is possible to calculate the origin of where a short occurred in the wind power plant WPP, based on knowledge of grid faults may be distributed in cobber at a speed of ⅔ of the speed of light.

The speed of light is close to $$300.000.000 \frac{m}{s}$$

Distribution speed of grid fault in cobber is then $$\frac{2 \cdot 300.000.000}{3} = 200.000.000 \frac{m}{s}$$

With a clock precision at 2 μs the grid fault will spread $$200.000.000 \frac{m}{s} \cdot 0,000002s = 400m$$

between two clocks and therefore it is possible to determine, based on the precise time stamp, down to a precision of 400 m where a short occurred.

If the individual distance between wind turbines WT in a wind power plant WPP is e.g. 500 m, an accuracy of the synchronized clock as in the above example would be precise enough to determine which wind turbine WT was stroked by a lightning which e.g. could be the origin of the fault/event E. If on the other hand the synchronized clock is slow relative to the distribution of faults in a wind power plant WPP the location of the origin of a fault can be difficult to determine and therefore it is desirable to have a fast and/or high precision synchronized clock.

In substations SUB as e.g. a metrological station the clock of the data processor does not have to be as fast or precise as in other data processors in the wind power plant WPP. Event data from a metrological substation SUB may e.g. comprise measurement of temperature, wind speed, rain and hours of sun, these events does not change at a rate requiring data processors with a clock down to 2 μs. In substations SUB as e.g. a metrological station time synchronization of the clock may not be necessary FIG. 11 illustrates an overview of a wind power system WPS communicating between data processors DPE by means of hardware supported precision time protocol e.g. based on the IEEE-1588 standard. In an alternative embodiment of the invention, the communication is performed by means of an earth satellite system e.g. GPS or dedicated communication lines may be arranged between data processors DPE of the wind power system WPS.

The figure illustrates a utility grid UG, substations SUB1, . . . , SUBn, wind turbine WT1, . . . , WTn. The substation SUB1 comprises a master clock MC which alternatively may be provided from the data communication related to the utility grid UG. The sensor elements SE1, . . . , SEn, the actuator elements AC1, . . . , ACn, and the controllers CO1, CO2, CO3, . . . , COn may comprise a data processor DPE having a slave/local clock LC referring to the master clock MC. The mentioned elements are illustrated as elements of wind turbine WT1, but could also be part of substations SUB or each of the controllers CO1, CO2, CO3, . . . , COn could represent individual wind turbines WT. Furthermore, it should be noted that the mentioned data processors could be referred to as nodes of the network.

FIG. 12A illustrates a simplified view of a sensor element SE1 according to an embodiment of the invention, the sensor element SE1 is adapted to obtain measurements/events such as e.g. vibrations, wind speed, temperature, pressure, etc. The illustrated sensor element SE1 comprises a transducer element TR, a local clock LC, a data processor DPE, a buffer BU and a hardware component HD such as a more permanent storage or control logic.

Some communication paths are illustrated by means of arrows, but these are only to illustrate the specific embodiment, other sensor elements may comprise further components and other communication paths.

A sensor element SE1 as illustrated with a data processor DPE such as a microprocessor, FPGA, etc. may be adapted to perform armed samplings or measurements. This is to be understood as e.g. sampling of data or measuring of data at a predetermined point in time. Because the data processors DPE of the wind power system comprise a local clock LC referring to the master clock MC, it is possible to perform simultaneous sampling or measuring of data in the entire wind power system WPS. The sensor element SE1 is communicating with other elements of the wind power system WPS such as controllers and reference clocks, etc. by means of signals SI.

An example of the above at park level could e.g. be to picture the wind at specific point in time e.g. a relative time t=5. As the synchronous time domain in the data processors is very precise, the wind is measured very precisely at the same time t=5 in the entire wind power system WPS.

An example of wind turbine WT level could be as mentioned above, measuring of vibrations on a physical structure.

In the illustrated sensor element SE1, the data to be measured is measured by the transducer TR referring to a data processor element DPE which again refers to the local clock LC. The local clock LC is precisely synchronised, e.g. by means of the precise time protocol as described in the IEEE-1588 standard, to the master clock MC. The measurements are temporally stored in a buffer BU of a kind as described above. If any event triggered in the illustrated sensor element SE1 or e.g. in any other elements in the wind power system WPS the content of the buffer is stored in the hardware component HD or sent directly to the control unit controlling the sensor element SE1.

As mentioned, the illustrated sensor element SE1 could be any measuring or actuating element and also comprises components which are not mentioned in relation to this example. Furthermore, such sensor element could also comprise a dedicated processor or hardware adapter to perform time stamping.

FIG. 12B illustrates a part of a controller CO according to an embodiment of the invention e.g. controlling a sensor or an actuator element as illustrated in FIG. 11.

The input part of the controller CO may comprise a time related hardware component THD capable of receiving data e.g. from a sensor and as soon as the data is received by the time related hardware component, the data is time stamped. The time related hardware component THD is connected to the local clock LC which as mentioned refers to the master clock MC.

As described above time stamped measurements or events are temporarily stored in a buffer BU and, e.g. at a predetermined point in time or trigged by an event or other elements of the wind power system WPS transferred to a more permanent data storage illustrated as the hardware component HD. The illustrated components communicate with other parts of the controller or other elements of the wind power system WPS by means of signals SI.

It should be noted that also event data received by the controller may be time stamped by means of a dedicated processor or perform armed sampling or measurements.

The invention claimed is:

1. A method for registering events in a wind power system, said method comprising:
   mutually time synchronizing first and second data processors of said wind power system;
   registering a first event in said first data processor;
   registering a second event in said second data processor;
   establishing a relative timing of said first and second events registered in said first and second data processors according to said time synchronization;
   correlating said first and second events in the time domain based at least in part on said relative timing; and
   determining whether said first and second events are related to a common triggering event based on a result of said correlation; and
   controlling at least part of the wind power system based on the determination of whether said first and second events are related to the common triggering event.

2. The method of claim 1, wherein said first and second data processors are comprised in a wind turbine.

3. The method of claim 1, wherein said first and second data processors are distributed in a plurality of wind turbines.

4. The method of claim 1, wherein said first and second data processors include at least one wind turbine controller.

5. The method claim 1, wherein said time synchronization includes a synchronization to a master clock.

6. The method of claim 1, wherein each of said first and second data processors comprises a time synchronization device that is configured to establish the time synchronization.

7. The method of claim 1, wherein said time synchronization device synchronizes to a master clock and establishes a synchronized clock on the basis of said master clock and a local clock, and the local clock is comprised in or communicating with said time synchronization device.

8. The method of claim 1, wherein the wind power system includes a plurality of wind turbines, and the wind turbines comprise a local clock.

9. The method of claim 1, wherein said time synchronization is established on the basis of an internal clock of the wind power system, or on the basis of an external clock transmitted from an external time synchronization arrangement comprising a master clock.

10. The method of claim 1, wherein said time synchronization of said first and second data processors in the wind power system is established by using an existing communication network within the wind power system, a dedicated line, or an earth satellite system.

11. The method of claim 1, wherein the wind power system includes a wind turbine comprising said first data processor and a substation comprising said second data processor.

12. The method claim 1, wherein the wind power system is controlled at least partly by predictive control based on said time synchronization.

13. The method of claim 1, wherein event information is transmitted as time stamped events according to said time synchronization of said first and second data processors, said time stamped events are transmitted to an event information analyzer, and said event information analyzer analyses the event information on the basis of said time synchronization.

14. The method of claim 13, wherein said event information analyzer analyzes the event information on the basis of said time synchronization by establishment of a relative timing based on the receipt of the event information.

15. A method for analyzing events of or controlling at least part of a wind power system comprising first and second data processors, said method comprising:
    mutually synchronizing said first and second data processors of said wind power system according to a synchronized time;
    registering a first event in said first data processor;
    registering a second event in said second data processor;
    time stamping said first and second registered events;
    correlating said first and second registered and time stamped events in the time domain to determine if said first and second registered and time stamped events are related to a common triggering event; and
    controlling at least part of the wind power system based on said first and second registered and time stamped events.

16. The method of claim 15, wherein said time synchronization enables defining a set-point in a time domain, and said set-point is a global set-point common in respect of all synchronized data processors.

17. The method of claim 16, wherein said wind power system is at least partly controlled in relation to said set-point.

18. The method of claim 15, wherein said wind power system includes an earth satellite system receiver.

19. A wind power system comprising:
    a master clock;
    first and second data processors each including a slave clock;
    means for mutually synchronizing said slave clock of each of said first and second data processors according to said master clock;
    one or more sensors for registering one or more events occurring in said wind power system;
    means for creating one or more event data based on said one or more registered events;
    means for time stamping, in said first and second data processors, of said one or more event data, in accordance with said slave clock; and
    means for analysing the said event based on said time stamped event data or means for controlling at least part of said wind power system based on said time stamped event data,
    wherein said time stamped data in said first data processor is correlated with said time stamped data in said second data processor in the time domain to determine if said one or more events are related to a common triggering event.

20. The method of claim 13, wherein the accuracy of the time stamp of the time stamped event is better than 500 µs, or better than 200 µs, or better than 10 µs, or better than 2 µs.

* * * * *

UNITED STATES PATENT AND TRADEMARK OFFICE
CERTIFICATE OF CORRECTION

| | |
|---|---|
| PATENT NO. | : 8,090,972 B2 |
| APPLICATION NO. | : 12/744166 |
| DATED | : January 3, 2012 |
| INVENTOR(S) | : Bengtson et al. |

It is certified that error appears in the above-identified patent and that said Letters Patent is hereby corrected as shown below:

In the Specification:

At column 1, line number 13, after "control", insert --of-- and at line number 14, change "to" to --of-- and at line number 23, change "analyses" to --analyzes--.

At column 2, line number 33, change "comprises" to --comprise-- and at line number 36, change "is" to --are-- and at line number 55, change "is" to --are-- and at line number 59, change "as" to --was--.

At column 3, line number 5, change "preferable" to --preferably-- and at line number 19, change ";" to --:-- and at line number 26, change "analyses" to --analyzes-- and at line number 32, change "and" to --an-- and at line number 40, after "insofar", insert --as--.

At column 4, line number 15, change "preferable" to --preferably-- and at line number 29, change "is" to --are-- and at line number 37, change "is" to --are-- and at line number 45, change "comprises" to --comprise-- and at line number 61, change "referred" to --referring--.

At column 5, line number 24, change "tow" to --two-- and at line number 25, after "used", insert --,-- and at line number 26, after "colliding", insert --with-- and change "taken" to --taking-- and at line number 45, after "stamp", insert --of-- and at line number 47, change ";" to --:-- and at line number 51, change "precise" to --precisely-- and at line number 52, after "turbine", insert --;-- and at line number 53, after "by", delete "a" and at line number 58, change "physical" to --physically--.

Signed and Sealed this
Twenty-seventh Day of March, 2012

David J. Kappos
*Director of the United States Patent and Trademark Office*

CERTIFICATE OF CORRECTION (continued)

In the Specification:

At column 6, line number 2, after "describing", insert --an-- and at line number 11, change "a 1 pulse pr second the" to --1 pulse per second. The-- and at line number 20, change "are" to --is-- and at line number 24 , change ";" to --:-- and at line number 29, change "packet, in" to --packet. In-- and at line number 32, change "stamp" to --stamped-- and at line number 47, change ";" to --:--.

At column 7, line number 33, change "interval's" to --intervals-- and change "trigged" to --triggered-- and at line number 44, change "," to --;-- and at line number 45, change "turbine" to --turbines-- and at line number 47, after "where", delete "to" and at line number 52, change "trigging" to --triggering-- and change "shut down" to --shutdown-- and at line number 56, change "use" to --used--.

At column 8, line number 1, change "events" to --event is-- and at line number 48, change "of" to --to--.

At column 9, line number 1, change "is" to --are-- and at line number 30, change "stamp" to --stamped-- and at line number 61, change ";" to --:-- and at line number 62 change two occurrences of ";" to --:-- and at line number 66, change "indirect" to --indirectly--.

At column 10, line number 5, change "determined" to --determine-- and at line number 24, change "illustrates" to --illustrate-- and at line number 59, change ";" to --:-- and at line number 60, change two occurrences of ";" to --:-- and at line number 65, change "turbine" to --turbines-- and change "substation" to --substations-- and at line number 66, change "plant" to --plants--.

At column 11, line number 37, change "spaces" to --spaced-- and at line number 45, change ";" to --:-- and at line number 65, change "wireless" to --wirelessly--.

At column 12, line number 18, change "build" to --building-- and at line number 19, change "is" to --are-- and at line number 20 change "has" to --have-- and at line number 40, after "internal", insert --of--.

CERTIFICATE OF CORRECTION (continued)

In the Specification:

At column 13, line number 23, change "comprised" to --comprise--.

At column 14, line number 4, change "temporary" to --temporarily-- and at line number 20, change "by" to --be-- and at line number 39, change two instances of ";" to --:-- and at line number 57, change ";" to --:-- and at line number 58, change "units" to --unit.--.

At column 15, line number 4, change "the a" to --a-- and at line number 13, change "is" to --are-- and at line number 48, change "is" to --are-- and at line number 60, change "of a" to --of-- and at line number 63, change "is" to --are--.

At column 16, line number 10, change "effected" to --affected-- and at line number 20, change "are" to --is-- and at line number 33, change "temporary" to --temporarily-- and change "," to --;-- and at line number 35, change "temporary" to --temporarily-- and at line number 37, change "temporary" to --temporarily-- and at line number 63, change two occurrences of "trigged" to --triggered--.

At column 17, line number 31, change "of a" to --of-- and at line number 42, change "In" to --It--.

At column 18, line number 17, change "is" to --are-- and at line number 20, change "distribute" to --distributes-- and at line number 22, change "trigs" to --triggers-- and at line number 32, change "trigs" to --triggers--.

At column 19, line number 55, change "pps; pulse pr" to --pps: pulse per--.

At column 20, line number 27, change ";" to --:-- and at line number 45, change "temporally" to --temporarily-- and at line number 46, change "trig" to --trigger-- and at line number 48, change "10a" to --10A-- and at line number 51, change "trigs" to --triggers-- and at line number 52, change "blocks" to --block-- and at line number 64, change "describe" to --described--.

At column 21, line number 4, change "blocks" to --block-- and at line number 24, change "by a" to --by-- and at line number 43, change "10b" to --10B-- and at line number 45, change "of a" to --of-- and at line number 57, change "is" to --are-- and at line number 64, change "is" to --are--.

CERTIFICATE OF CORRECTION (continued)
U.S. Pat. No. 8,090,972 B2

In the Specification:

At column 22, line number 5, change "analyzes" to --analysis-- and at line number 9, change "electrical" to --electrically-- and at line number 11, change "cobber" to --copper-- and at line number 15, change "cobber" to --copper-- and at line number 54, change "does" to --do--.

At column 23, line number 14, change "invention, the" to --invention. The-- and at line number 50, change "temporally" to --temporarily--.

At column 24, line number 7, change "trigged" to --triggered--.